(12) United States Patent
Kester et al.

(10) Patent No.: US 10,808,319 B1
(45) Date of Patent: Oct. 20, 2020

(54) SYSTEM AND METHOD FOR VAPOR DEPOSITION OF SUBSTRATES WITH CIRCULAR SUBSTRATE FRAME THAT ROTATES IN A PLANETARY MOTION AND CURVED LENS SUPPORT ARMS

(71) Applicant: Quantum Innovations, Inc., Central Point, OR (US)

(72) Inventors: Norman L. Kester, Rogue River, OR (US); Cliff J. Leidecker, Rogue River, OR (US); John B. Glarum, Gold Hill, OR (US); Wade E. Nielson, Central Point, OR (US); Briant D. Walton, Rogue River, OR (US)

(73) Assignee: Quantum Innovations, Inc., Central Point, OR (US)

( * ) Notice: Subject to any disclaimer, the term of this patent is extended or adjusted under 35 U.S.C. 154(b) by 160 days.

(21) Appl. No.: 15/681,602

(22) Filed: Aug. 21, 2017

Related U.S. Application Data

(63) Continuation-in-part of application No. 13/030,091, filed on Feb. 17, 2011, now Pat. No. 10,550,474.
(Continued)

(51) Int. Cl.
*C23C 16/458* (2006.01)
*C23C 14/22* (2006.01)
(Continued)

(52) U.S. Cl.
CPC ........ *C23C 16/4588* (2013.01); *C23C 14/228* (2013.01); *C23C 14/505* (2013.01); *C23C 14/54* (2013.01); *C23C 14/568* (2013.01)

(58) Field of Classification Search
CPC ..... C23C 14/228; C23C 14/54; C23C 14/568; C23C 16/458; C23C 16/4587;
(Continued)

(56) References Cited

U.S. PATENT DOCUMENTS 4,008,683 A 2/1977 Rose
4,237,183 A 12/1980 Fujiwara et al.
(Continued)

FOREIGN PATENT DOCUMENTS

DE 19836652 2/2000

*Primary Examiner* — Benjamin Kendall
(74) *Attorney, Agent, or Firm* — Jerry Haynes Law

(57) ABSTRACT

A deposition system includes a system housing having a housing interior, a fixture transfer assembly having a generally sloped fixture transfer rail extending through the housing interior, a plurality of sequentially ordered deposition chambers connected by the fixture transfer rail, a controller interfacing with the processing chambers and at least one fixture carrier assembly carried by the fixture transfer rail and adapted to contain at least one substrate. The fixture carrier assembly travels along the fixture transfer rail under influence of gravity. A substrate fixture contains a substrate. The substrate fixture comprises a fixture frame. The fixture frame is defined by multiple circular members adjacently joined in a circular arrangement. Each circular member has a fixture frame opening sized to receive the substrate. Lens support arms may integrate into the circular members, extending in a curved disposition into the fixture frame opening to retain the substrate. A deposition method is also disclosed.

17 Claims, 15 Drawing Sheets

Related U.S. Application Data

(60) Provisional application No. 62/377,861, filed on Aug. 22, 2016, provisional application No. 61/343,668, filed on May 3, 2010, provisional application No. 61/343,669, filed on May 3, 2010, provisional application No. 61/343,672, filed on May 3, 2010, provisional application No. 61/338,949, filed on Feb. 26, 2010, provisional application No. 61/338,951, filed on Feb. 26, 2010.

(51) Int. Cl.
*C23C 14/54* (2006.01)
*C23C 14/50* (2006.01)
*C23C 14/56* (2006.01)

(58) Field of Classification Search
CPC ... C23C 16/4588; C23C 14/50; C23C 14/505; H01J 37/32889; H01J 37/32899; H01L 21/67173; H01L 21/67326; H01L 21/677; H01L 21/67703; H01L 21/67706; H01L 21/67712; H01L 21/67724; H01L 21/6773
See application file for complete search history.

(56) References Cited

U.S. PATENT DOCUMENTS

| | | | |
|---|---|---|---|
| 4,485,759 A | 12/1984 | Brandolf | |
| 4,663,009 A * | 5/1987 | Bloomquist | C23C 14/14 204/192.15 |
| 4,858,556 A * | 8/1989 | Siebert | C23C 14/54 118/664 |
| 4,981,408 A | 1/1991 | Hughes | |
| 5,026,469 A | 6/1991 | Kunkel et al. | |
| 5,370,737 A | 12/1994 | Mathis | |
| 5,424,096 A * | 6/1995 | Anthony | C23C 16/271 427/249.11 |
| 5,782,979 A * | 7/1998 | Kaneno | C23C 16/301 118/500 |
| 5,858,102 A * | 1/1999 | Tsai | C23C 16/4584 118/719 |
| 6,090,444 A | 7/2000 | Wixon et al. | |
| 6,251,551 B1 | 6/2001 | Kunze-Concewitz | |
| 6,294,227 B1 | 9/2001 | Anma et al. | |
| 6,592,675 B2 * | 7/2003 | Nishikawa | C23C 16/4584 118/500 |
| 6,817,712 B2 | 11/2004 | Hayashi | |
| 7,014,664 B2 | 3/2006 | Inzuka | |
| 8,182,608 B2 * | 5/2012 | Kerr | C23C 16/45551 118/719 |
| 2001/0015074 A1 | 8/2001 | Hosokawa | |
| 2003/0059557 A1* | 3/2003 | Harshavardhan | C23C 14/505 427/595 |
| 2003/0190223 A1 | 10/2003 | Peiter | |
| 2003/0221624 A1* | 12/2003 | Jurgensen | C23C 16/4584 118/725 |
| 2005/0019504 A1 | 1/2005 | Bi et al. | |
| 2006/0102078 A1 | 5/2006 | Fairbairn et al. | |
| 2006/0049044 A1 | 9/2006 | Seddon | |
| 2007/0098895 A1* | 5/2007 | Smith | C23C 14/352 427/255.7 |
| 2007/0197681 A1 | 8/2007 | Lowery et al. | |
| 2008/0026598 A1* | 1/2008 | Jang | C23C 16/4401 438/795 |
| 2008/0203636 A1* | 8/2008 | Schenck | B25B 5/003 269/25 |
| 2008/0220264 A1 | 9/2008 | Iyer et al. | |
| 2009/0169766 A1 | 7/2009 | Takahashi et al. | |
| 2009/0234450 A1 | 9/2009 | Lowery et al. | |
| 2009/0320755 A1 | 12/2009 | Liu et al. | |
| 2010/0040801 A1 | 2/2010 | Mitsuishi et al. | |
| 2010/0102025 A1 | 4/2010 | Eagerton | |
| 2010/0137984 A1 | 6/2010 | Lowery et al. | |
| 2010/0162955 A1 | 7/2010 | Lei et al. | |
| 2010/0313809 A1 | 12/2010 | Guo et al. | |
| 2012/0223048 A1* | 9/2012 | Paranjpe | C23C 14/042 216/22 |
| 2015/0086303 A1* | 3/2015 | Nakagawa | H01L 21/67173 414/222.13 |

* cited by examiner

SYSTEM AND METHOD FOR VAPOR DEPOSITION OF SUBSTRATES WITH CIRCULAR SUBSTRATE FRAME THAT ROTATES IN A PLANETARY MOTION AND CURVED LENS SUPPORT ARMS

CROSS-REFERENCE TO RELATED APPLICATIONS

This application claims the benefit of U.S. provisional application No. 62/377,861, filed Aug. 22, 2016 and entitled SYSTEM AND METHOD FOR VAPOR DEPOSITION OF SUBSTRATES WITH CIRCULAR SUBSTRATE FRAME THAT ROTATES IN A PLANETARY MOTION AND CURVED LENS SUPPORT ARMS, which provisional application is hereby incorporated by reference herein in its entirety and is continuation-in-part of application Ser. No. 13/030,091, filed Feb. 17, 2011 and entitled VAPOR DEPOSITION SYSTEM AND METHOD which claims the benefit of U.S. provisional application No. 61/338,949, filed Feb. 26, 2010 and entitled FIXTURE TO SUSPEND OPTHALMIC LENSES FOR CONCAVE AND CONVEX SIDE APPLICATIONS; U.S. provisional application No. 61/338,951, filed Feb. 26, 2010 and entitled FIXTURE DEVICE FOR THE APPLICATION OF VAPOR DEPOSITION ON THE CONCAVE AND CONVEX SIDES OF AN OPHTHALMIC LENS WHILE ROTATING"; U.S. provisional application No. 61/343,668, filed May 3, 2010 and entitled GRAVITY FED TRANSFER MECHANISM; U.S. provisional application No. 61/343,669, filed May 3, 2010 and entitled HYDROPHOBIC, OLEOPHOBIC OR SUPER HYDROPHOBIC APPLICATOR; and U.S. provisional application No. 61/343,672, filed May 3, 2010 and entitled FULLY AUTOMATED, IN-LINE, HIGH THROUGHPUT, LOW VOLUME, SIMULTANEOUS AND NON-SIMULTANEOUS PROCESS, HIGH AND LOW VACUUM, PHYSICAL VAPOR DEPOSTION SYSTEM, each of which applications are incorporated by reference herein in their entirety.

FIELD OF THE INVENTION

The disclosure generally relates to coatings for optical lenses and other substrates. More particularly, the disclosure relates to a physical or chemical vapor, corona method, or thermal evaporation deposition system and method which facilitate sequential application of coatings to an optical lens or other substrate by gravity-actuated transfer of the substrates between successive deposition chambers and retention of the optical lens or other substrate in a circular substrate fixture having a plurality of integrated lens support arms.

BRIEF DESCRIPTION OF THE DRAWINGS

The disclosure will now be made, by way of example, with reference to the accompanying drawings, in which:

FIG. 10A is a front perspective view, and FIG. 10B is an exploded perspective view;

DETAILED DESCRIPTION

Figure 1:
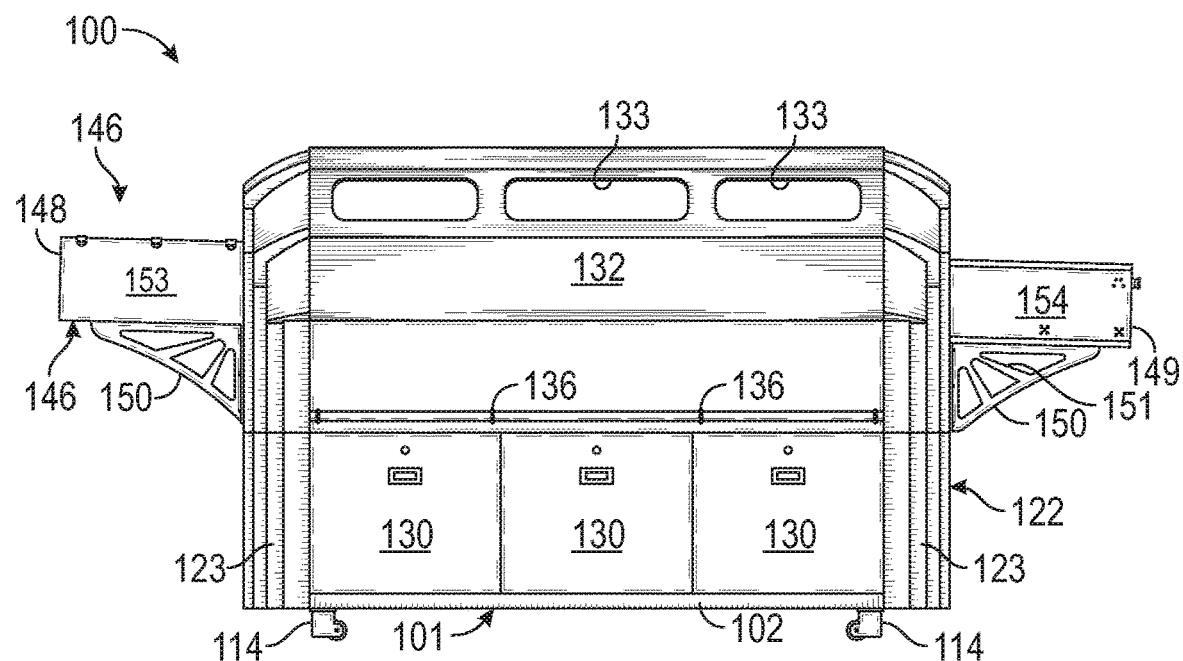
FIG. 1 is a front view of an illustrative embodiment of the physical vapor deposition system.

The following detailed description is merely exemplary in nature and is not intended to limit the described embodiments or the application and uses of the described embodiments. As used herein, the word "exemplary" or "illustrative" means "serving as an example, instance, or illustration." Any implementation described herein as "exemplary" or "illustrative" is not necessarily to be construed as preferred or advantageous over other implementations. All of the implementations described below are exemplary implementations provided to enable persons skilled in the art to practice the disclosure and are not intended to limit the scope of the appended claims. Furthermore, there is no intention to be bound by any expressed or implied theory presented in the preceding technical field, background, brief summary or the following detailed description.

Referring initially to FIGS. 1-11 of the drawings, an illustrative embodiment of the physical vapor deposition system, hereinafter "system", is generally indicated by reference numeral 100. As will be hereinafter further described, the system 100 is configured for vapor deposition of a substrate with circular substrate frame that rotates in a planetary motion and curved lens support arms. An illustrative embodiment of the system includes a system housing having a housing interior, a fixture transfer assembly having a generally sloped fixture transfer rail extending through the housing interior, a plurality of processing chambers connected by the fixture transfer rail, a controller interfacing with the processing chambers and at least one fixture carrier assembly carried by the fixture transfer rail and adapted to securely retain at least one substrate or optical lens in a circular substrate fixture having a plurality of integrated lens support arms. The lens support arms are resilient to enable adjustability and curved to optimize engagement with the surface area of the substrate. The fixture carrier assembly travels along the fixture transfer rail under influence of gravity.

The disclosure is further generally directed to a physical vapor deposition method. An illustrative embodiment of the method includes providing a sloped gradient, providing a plurality of processing chambers along the sloped gradient, providing a fixture carrier assembly, placing substrates in the fixture carrier assembly and transporting the fixture carrier assemblies into and between the processing chambers along the sloped gradient under influence of gravity.

Those skilled in the art will recognize that optical lenses of eyewear such as eyeglasses and sunglasses may include one or more optical coatings which impart a desired appearance or optical characteristic to the lenses. An optical coating includes one or multiple layers of material which are deposited on one or both sides of an optical lens and affects the manner in which the lens reflects and transmits light. In some applications, it may be necessary or desirable to sequentially apply multiple layered coatings to one or both surfaces of an optical lens. For example, application of optical coatings to one or both surfaces of optical lenses for eyewear may include application of metallic, dielectric, dichroic, hydrophobic, oleophobic or super hydrophobic coatings to the lenses in a sequential manner. The system 100 is configured to perform application of coatings to optical lenses among multiple deposition chambers in a manner which is both efficient and does not risk physical contact or contamination of the freshly-applied coatings on the lens.

As FIG. 1 references, the system 100 is adapted to sequentially apply one or more coatings (not illustrated) on one or both surfaces (not illustrated) of a substrate (illustrated in phantom in FIG. 11) using a physical or chemical vapor, corona method or thermal evaporation deposition process. In some applications, the substrate may be an optical lens of eyewear such as eyeglasses or sunglasses, for example and without limitation. The coating(s) which is/are applied to the substrate may be metallic, dielectric, dichroic, hydrophobic, oleophobic or super hydrophobic coatings, for example and without limitation, which may serve as anti-reflective coatings, band pass filters, constructive filters, destructive filters, high-reflector coatings or other optical coatings known in the art. The processes which are used to apply the coatings to the substrate may be sequentially carried out in a series of multiple chambers 185. Each substrate may be transferred from one chamber 185 to the next chamber 185 in the deposition process via gravity, as will be hereinafter further described.

Figure 7:
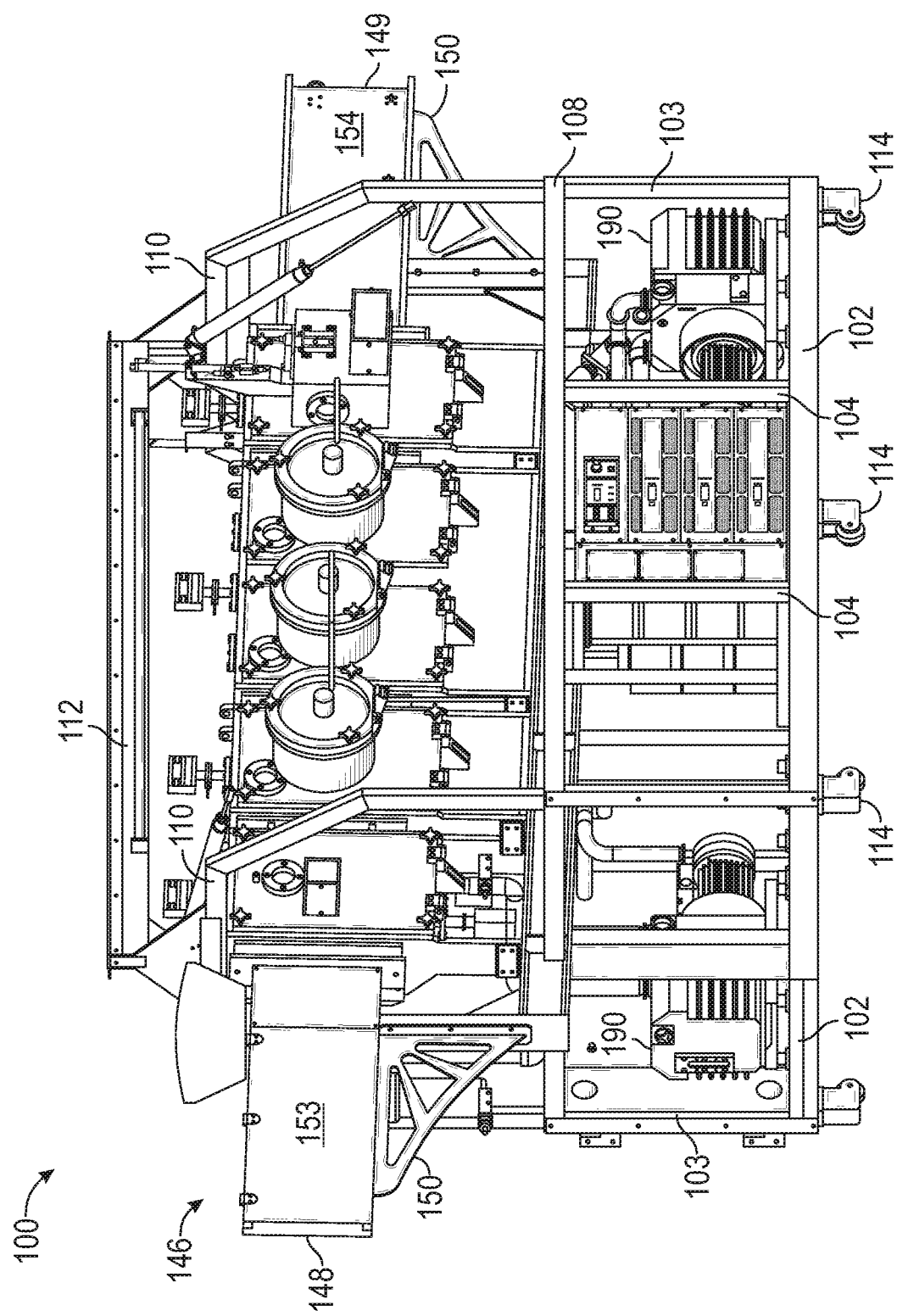
FIG. 7 is a perspective view of the illustrative physical vapor deposition system, more particularly illustrating an exemplary system frame and functional components of the system supported by the system frame.

The system 100 may include a system frame 101 which is adapted to support the various functional components of the system 100. As illustrated in FIG. 7, in some embodiments the system frame 101 may be generally elongated with a generally rectangular base frame portion 102. Multiple upright corner frame members 103 may extend from the respective corners of the base frame portion 102. Upright side frame members 104 may extend from the base frame portion 102 between the corner frame members 103.

A generally rectangular frame platform 108 may be supported by the corner frame members 103 and the side frame members 104. The corner frame members 103 may extend beyond the respective corners of the frame platform 108. Transverse frame members 110 may extend between the upper ends of the adjacent corner frame members 103 at each end of the system frame 101. A generally elongated top frame member 112 may extend between the transverse frame members 110. As illustrated in FIGS. 1-7, in some embodiments frame wheels 114 may be provided on the base frame portion 102 of the system frame 101 to render the system 100 portable. In other embodiments, the system frame 101 may be rendered immobile on a floor or other support surface (not illustrated). In alternative embodiments, the system frame 101 may have other shapes or designs which are consistent with the functional requirements of the system 100.

A system housing 122 may be provided on the system frame 101. In some embodiments, the system housing 122 may include a pair of side housing panels 123 provided at opposite ends of the system frame 101. The side housing panels 123 may be attached to the system frame 101 using fasteners (not illustrated) and/or alternative fastening techniques known by those skilled in the art.

Figure 6:
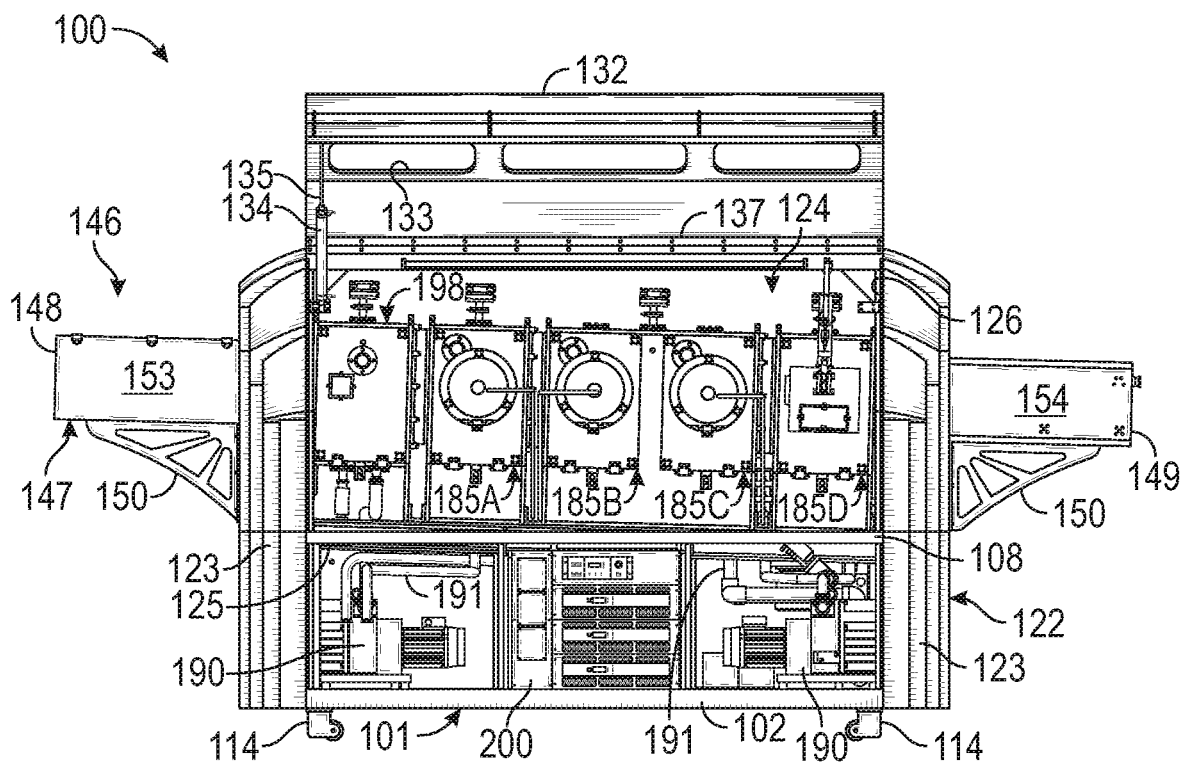
FIG. 6 is a front view of the illustrative physical vapor deposition system, with the front chamber compartment door and front subsystem compartment doors opened to expose a subsystem compartment.

As illustrated in FIG. 6, the system housing 122 may have a housing interior 124. The frame platform 108 of the system frame 101 may divide the housing interior 124 into a lower subsystem compartment 125 and an upper chamber compartment 126. The subsystem compartment 125 may contain various subsystem components of the system 100 which will be hereinafter described. The chamber compartment 126 may contain an etching chamber 198 as well as one or more of the PVD chambers 185 and other components of the system 100.

Figure 2:
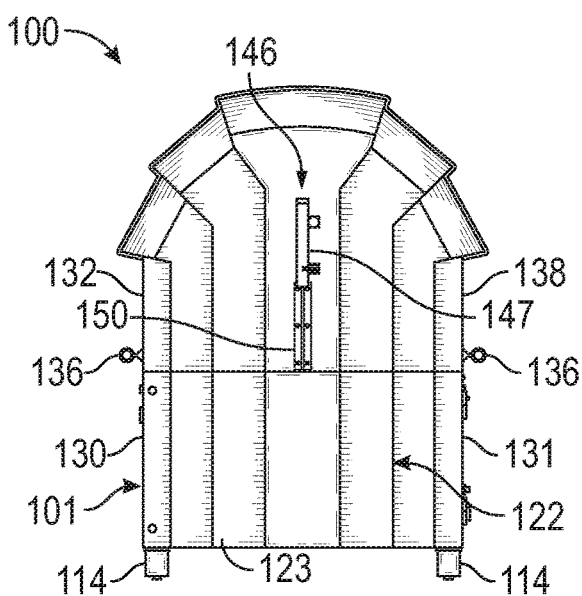
FIG. 2 is a side view of the illustrative physical vapor deposition system.
Figure 3:
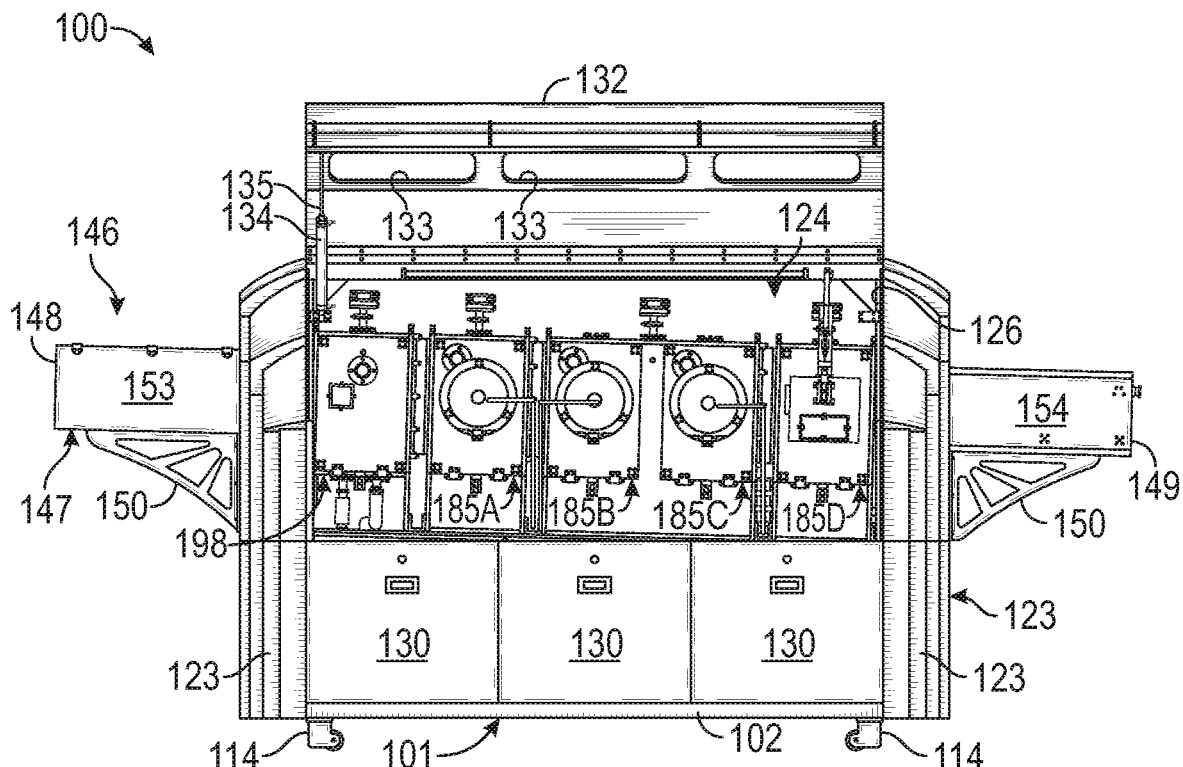
FIG. 3 is a front view of the illustrative physical vapor deposition system, with a front chamber compartment door opened to expose a chamber compartment.

As illustrated in FIGS. 1-4, the system housing 122 may include at least one front subsystem compartment door 130 provided on the system frame 101. In some embodiments multiple, adjacent front subsystem compartment doors 130 may be pivotally attached to the system frame 101. The front subsystem compartment doors 130 may be selectively opened to expose the subsystem compartment 125 at the front portion of the housing interior 124, as illustrated in FIG. 6, or selectively closed to conceal the subsystem compartment 125 at the front portion of the housing interior 124, as illustrated in FIGS. 1 and 3.

Figure 5:
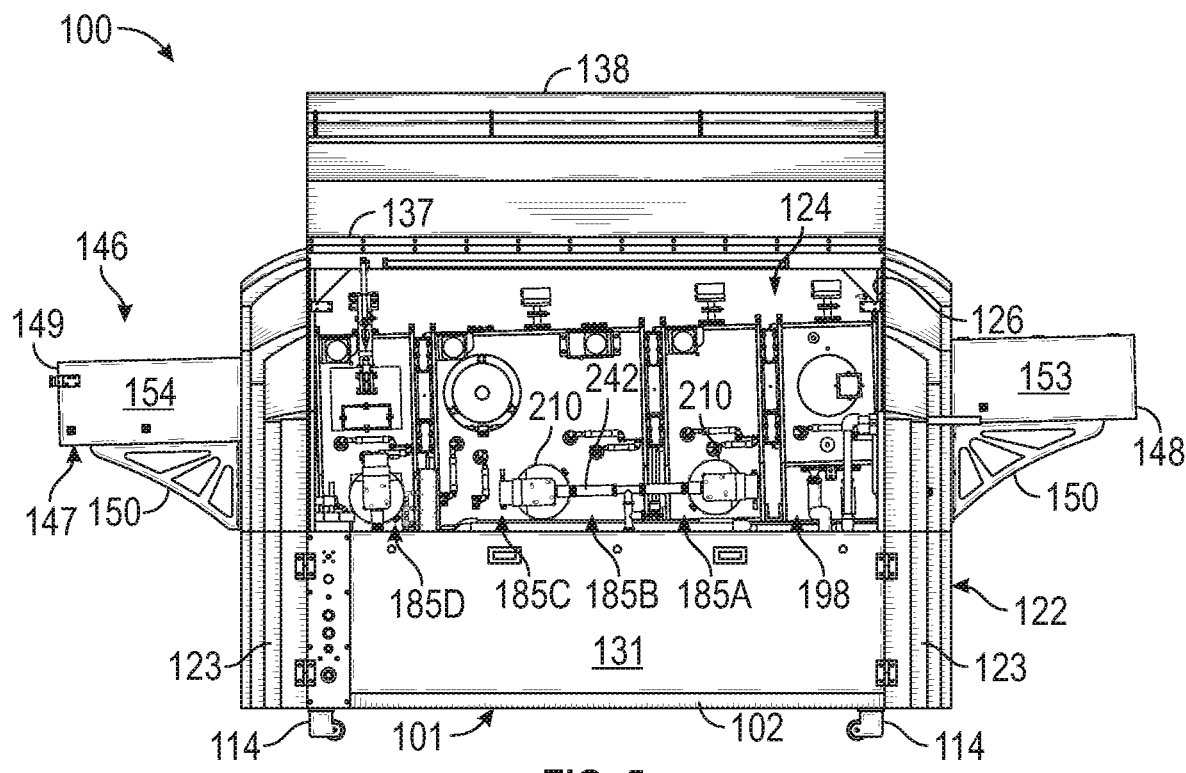
FIG. 5 is a rear view of the illustrative physical vapor deposition system, with the rear chamber compartment door opened to expose the chamber compartment.
Figure 8:
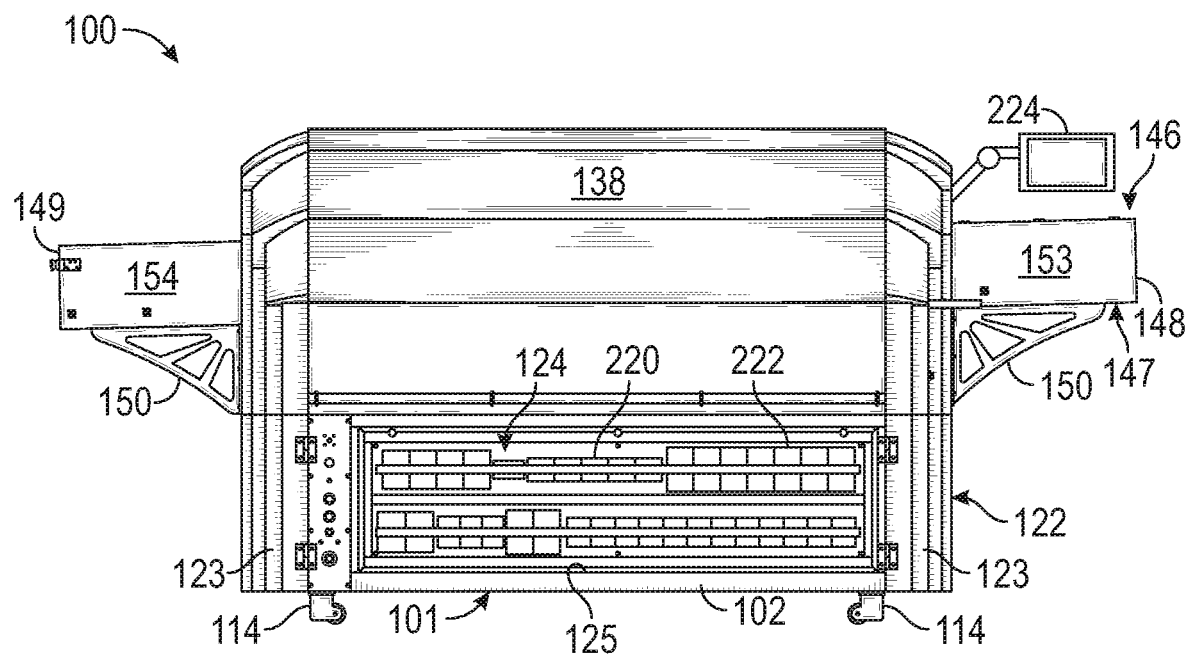
FIG. 8 is a rear view of the illustrative physical vapor deposition system, with the rear subsystem compartment door opened.

As illustrated in FIG. 5, the system housing 122 may further include at least one rear subsystem compartment door 131 provided on the system frame 101. The rear subsystem compartment door 131 may be selectively opened to expose the subsystem compartment 125 at the rear portion of the housing interior 124, as illustrated in FIG. 8, or selectively closed to conceal the subsystem compartment 125 at the rear portion of the housing interior 124, as illustrated in FIG. 5.

Figure 4:
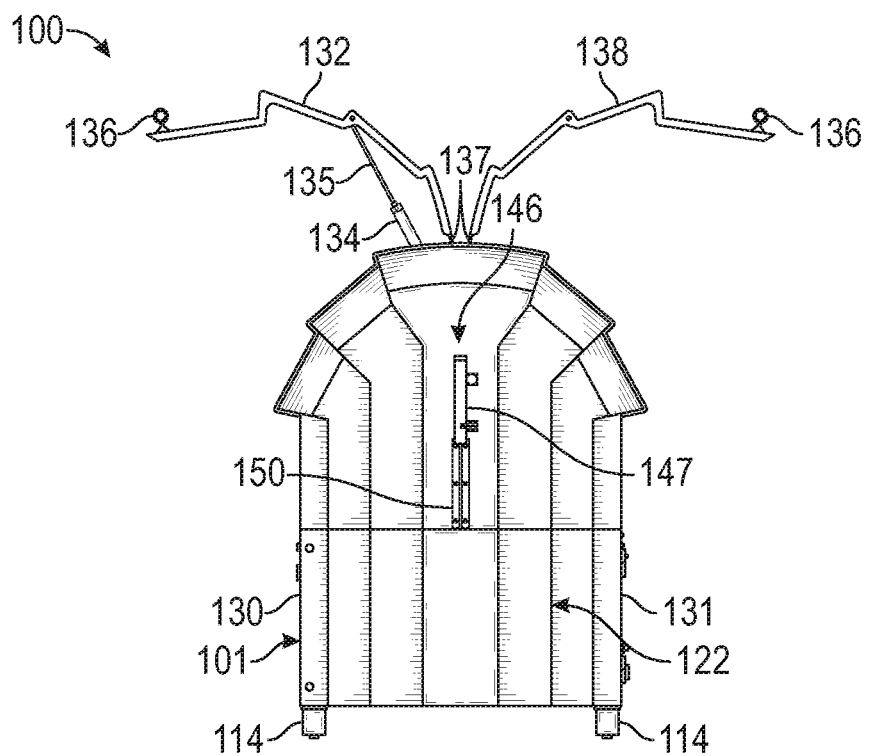
FIG. 4 is a side view of the illustrative physical vapor deposition system, with the front chamber compartment door and a rear chamber compartment door opened.

The system housing 122 may include a front chamber compartment door 132 provided on the system frame 101 to selectively expose and conceal the chamber compartment 126 at the front portion of the housing interior 124. The front chamber compartment door 132 may have multiple windows 133. In some embodiments, the front chamber compartment door 132 may be pivotally attached to the top frame member 112 (FIG. 7) and/or some other component of the system frame 101 via door hinges 137 (FIG. 4). At least one door handle 136 may be provided on the front chamber compartment door 132. The door handle 136 may be adapted to selectively lock the front chamber compartment door 132 in the closed position of FIGS. 1 and 2 or selectively unlock the front chamber compartment door 132 for opening as illustrated in FIGS. 3 and 4. As illustrated in FIGS. 3, 4 and 6, at least one door extension cylinder 134 may be attached to the system frame 101. A door extension piston 135 may be extendable from the door extension cylinder 134. The door extension piston 135 may be attached to an interior surface of the front chamber compartment door 132. Accordingly, when the front chamber compartment door 132 is closed, the door extension piston 135 is retracted into the door extension cylinder 134. When the front chamber compartment door 132 is open, the door extension piston 135 extends from the door extension cylinder 134 and maintains the front chamber compartment door 132 in the open position.

As illustrated in FIGS. 2, 4 and 5, the system housing 122 may further include a rear chamber compartment door 138 provided on the system frame 101 to selectively expose and conceal the chamber compartment 126 at the rear portion of the housing interior 124. The rear chamber compartment door 138 may have a design and attachment which are as were heretofore described with respect to the front chamber compartment door 132.

As further illustrated in FIGS. 1-9, the system 100 may include a fixture transfer assembly 146. The fixture transfer assembly 146 may include a generally elongated fixture transfer rail 147 which extends through the chamber compartment 126 of the housing interior 124 in the system housing 122. The fixture transfer rail 147 may have a fixture loading end 148 and a fixture unloading end 149. A loading ramp segment 153 and an unloading ramp segment 154 of the fixture transfer rail 147 may protrude beyond the respective loading and unloading ends, respectively, of the system housing 122. The fixture transfer rail 147 may generally slope downwardly from the fixture loading end 148 to the fixture unloading end 149.

Figure 9:
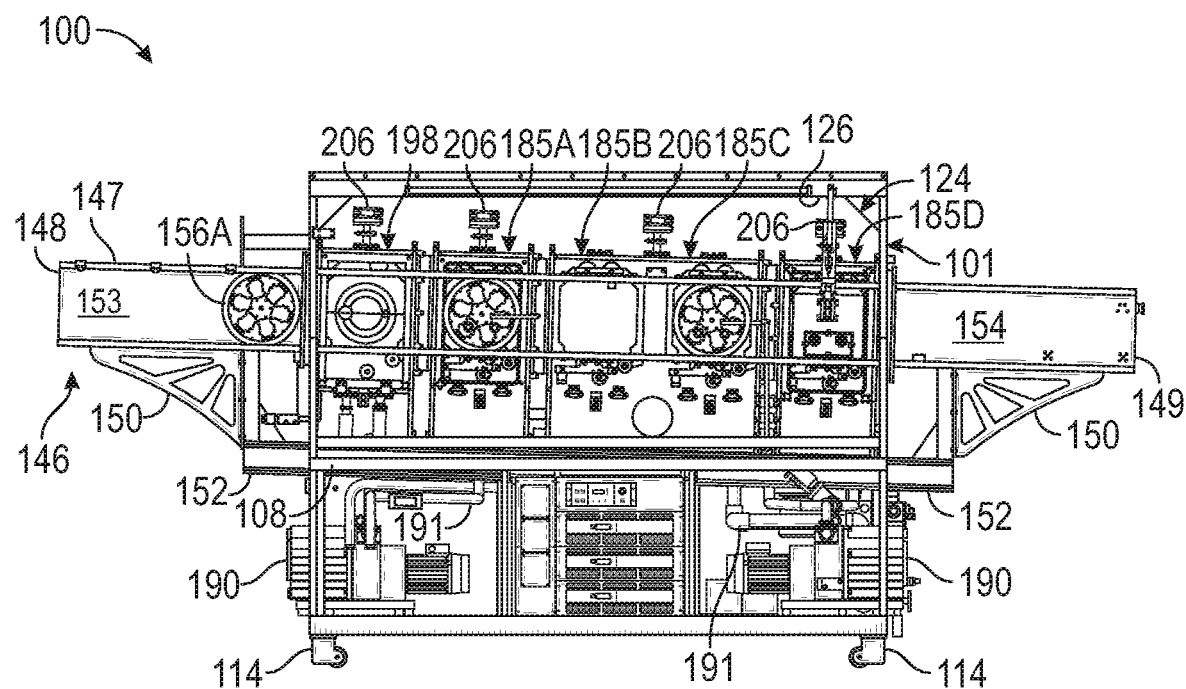
FIG. 9 is a front interior view of the chamber compartment and the subsystem compartment of the illustrative physical vapor deposition system.

The fixture transfer rail 147 of the fixture transfer assembly 146 may be mounted in the chamber compartment 126 of the housing interior 124 according to any suitable technique which is known by those skilled in the art. As illustrated in FIG. 9, in some embodiments, the fixture transfer assembly 146 may include a generally elongated chamber support member 152 which extends through the chamber compartment 126 in generally sloped relationship to the longitudinal axis of the system frame 101. The chamber support member 152 may be attached to the frame platform 108 and/or other structural component of the system frame 101 using welding, fasteners and/or other suitable attachment technique. A pair of rail support brackets 150 may attach the fixture transfer rail 147 to respective ends of the chamber support member 152. Accordingly, the fixture transfer rail 147 may be disposed above and in generally parallel, spaced-apart relationship with respect to the chamber support member 152. As illustrated in FIG. 1, the fixture transfer rail 147 may be sloped with respect to the horizontal at a slope angle 151. In some embodiments, the slope angle 151 may be about 91.50 degrees.

Figure 10A:
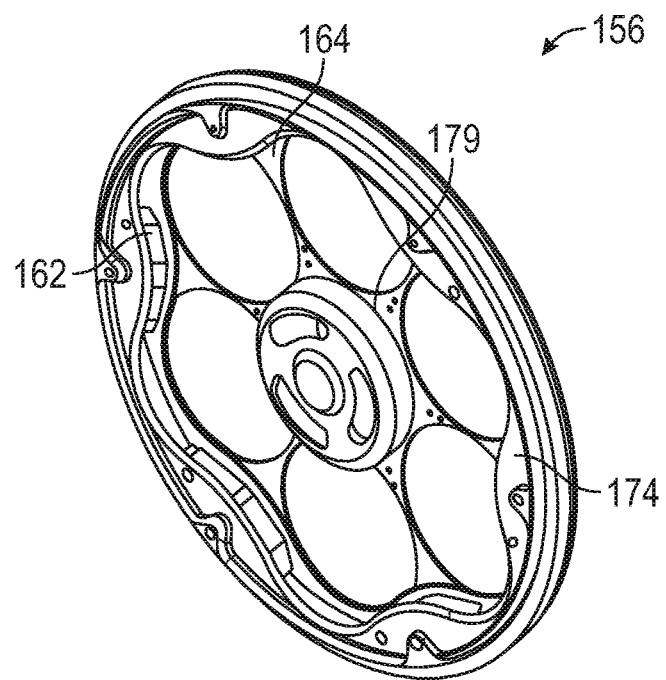
FIGS. 10A and 10B are views of an exemplary fixture carrier assembly which is suitable for implementation of the illustrative physical vapor deposition system, where
Figure 10B:
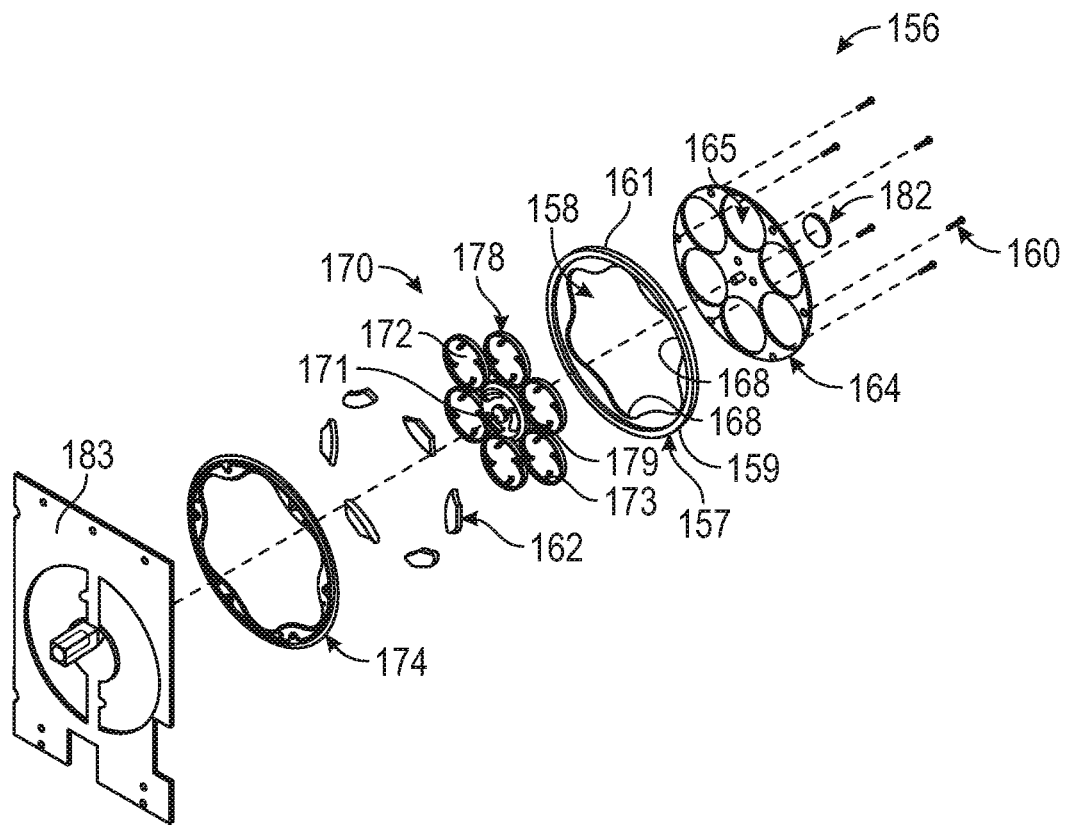

As illustrated in FIGS. 10A and 10B, the fixture transfer assembly 146 (FIGS. 1-9) may further include at least one fixture carrier assembly 156. In some embodiments, the fixture transfer assembly 146 may include multiple fixture carrier assemblies 156. As illustrated in FIG. 10B, each fixture carrier assembly 156 may include an annular assembly frame 157 having a frame opening 158. A circumferential frame flange 159 may extend into the frame opening 158. In some embodiments, the frame flange 159 may have an undulating configuration with typically six curved or arcuate frame undulations 168 which communicate with the frame opening 158. A circumferential rail groove 161 may be provided in the outer surface of the assembly frame 157 for purposes which will be hereinafter described.

As further illustrated in FIGS. 10A and 10B, a generally circular fixture mount plate 164 may be mounted in the frame opening 158 of the assembly frame 157. In some embodiments, the fixture mount plate 164 may be attached to the frame flange 159 (FIG. 10B) of the assembly frame 157 using fasteners 160. In other embodiments, the fixture mount plate 164 may be fabricated in one piece with the assembly frame 157 according to the knowledge of those skilled in the art. As further illustrated in FIG. 10B, multiple fixture openings 165 may be provided in the fixture mount plate 164 for purposes which will be hereinafter described. The fixture openings 165 in the fixture mount plate 164 may substantially correspond in number and position to the respective frame undulations 168 in the frame flange 159 of the assembly frame 157. An idler cartridge 162 may be provided on the fixture mount plate 164 adjacent to each fixture opening 165 for purposes which will be hereinafter described.

A substrate fixture 170 (FIG. 10B) may be mounted to the fixture mount plate 164 according to the knowledge of those skilled in the art. The substrate fixture 170 may include a center hub 179. A fixture frame 171 may extend from the center hub 179. The fixture frame 171 may include multiple, adjacent circular members 178 which may extend outwardly from the center hub 179. The circular members 178 of the fixture frame 171 may substantially correspond in number and position to the respective fixture openings 165 in the fixture mount plate 164 and the respective undulations 168 in the frame flange 159 of the assembly frame 157. Accordingly, the circular members 178 of the fixture frame 171 may be disposed inside for rotation within the respective fixture openings 165 in the fixture mount plate 164. In some embodiments, the substrate fixture 170 may be secured to the fixture mount plate 164 by clamping engagement of the idler cartridges 162 with the respective circular members 178 on the fixture frame 171 of the substrate fixture 170 and the fixture mount plate 164.

In some embodiments, a front rim 174 may clamp and secure the substrate fixture 170 to the fixture mount plate 164. In some embodiments, the front rim 174 may be attached to the substrate fixture 170 using fasteners 160. Additionally, the center hub 179 of the substrate fixture 170 may form a concentric fastening mechanism to facilitate fastening of the substrate fixture 170 to the fixture mount plate 164 according to the knowledge of those skilled in the art. Accordingly, the center hub 179 may be rotated in a first direction to facilitate fastening of the substrate fixture 170 to the fixture mount plate 164 and rotated in a second direction to facilitate disassembly of the substrate fixture 170 from the fixture mount plate 164. A center shield with solenoid hub stop 183 (shown for reference) may be mounted in the PVD chamber 185 (FIG. 3) or etching chamber 198 for engagement with the center hub 179 of the substrate fixture 170.

The fixture frame 171 of the substrate fixture 170 may form the peripheral structure of and provide structural integrity to the substrate fixture 170. The multiple circular members 178 of the fixture frame 171 may be adjacently joined in a circular arrangement around and mounted for rotation with respect to the concentric center hub 179. In some embodiments, the fixture frame 171 may include six circular members 178. Each circular member 178 of the fixture frame 171 may have a fixture frame opening 172.

In some exemplary embodiments, the fixture carrier assembly 156 may incorporate a wheel design that creates a planetary effect of the fixture mount plate 164 and the circular members 178 of the substrate fixture 170, which may rotate independently of each other. The fixture mount plate 164 and the circular members 178 of the substrate fixture 170 may rotate in the same direction or opposite directions. In some embodiments, the center hub 179 of the substrate fixture 170 may be fixed by means of the center shield with solenoid hub stop 183 while the fixture mount plate 164 may be driven by means of a separate gear.

The multiple circular members 178 of the substrate fixture 170 may act as lens rings (w/lens) and may rotate around the center hub 179 through the idler roller cartridges 162 that may be attached to the annular assembly frame 157. The resultant motion is rotation of the circular members 178 around the center hub 179 while the fixture mount plate 164 also rotates independently of the circular members 178, thereby creating a planetary system effect. The substrate fixture 170 and the assembly frame 157 with the fixture mount plate 164 may rotate in the same direction or opposite directions, and their angular velocities may be the same or different. In any case, this planetary rotational effect may be advantageous for addressing uniformity issues on the lens substrate as a result of the sputtering target architecture. The center shield with solenoid hub stop 183 may be periodically engaged to stop the center hub 179 from spinning and released, which may allow the center hub 179 to advance ⅓ of a revolution at a time. An RFID tag 182 may be provided on the fixture mount plate 164 or other component of each fixture carrier assembly 156 for the purpose of tracking multiple fixture carrier assemblies 156.

A plurality of integrated lens support arms 173 may extend from each circular member 178 inwardly into the corresponding fixture frame opening 172. In some embodiments, the lens support arms 173 may be integrated into the circular member 178 according to the knowledge of those skilled in the art, thereby forming a unitary substrate retention piece. In some embodiments, the lens support arms 173 may be pivotally attached to the circular member 178 via support arm pivot pins (not illustrated). The lens support arms 173 may be suitably sized and configured to engage and support a substrate (not illustrated) in the corresponding fixture frame opening 172 of each circular member 178. The lens support arms 173 may be sufficiently resilient to enable adjustability in retaining the substrate in a desired position. The lens support arms 173 may be generally curved to optimize engagement with the surface area of the substrate. The integrated lens support arms 173 may also be flexible so as to retain the substrate within the circular member 178. Because of this flexibility, the lens support arms 173 may be be pivoted into and out of the fixture frame opening 172 without requiring additional mechanical components such as a pivot pin, hinge, or sliding rail. In some embodiments, four lens support arms 173 may extend inwardly into each fixture frame opening 172.

Referring next to FIGS. 3, 5, 6 and 9 of the drawings, an etching chamber 198 and at least one PVD chamber 185 may be supported by the sloped fixture transfer rail 147 of the fixture transfer assembly 146 in the chamber compartment 126 of the housing interior 124. In some embodiments, the etching chamber 198 may be provided on the fixture transfer rail 147 with a first PVD chamber 185a, a second PVD chamber 185b, a third PVD chamber 185c, and a fourth PVD chamber 185d. The etching chamber 198 may be disposed closest to the fixture loading end 148 of the fixture transfer rail 147. The fourth PVD chamber 185d may be disposed closest to the fixture unloading end 149 of the fixture transfer rail 147. The first PVD chamber 185a, the second PVD chamber 185b and the third PVD chamber 185c may be sequentially ordered between the etching chamber 198 and the fourth PVD chamber 185d. The etching chamber 198 and each of the PVD chambers 185 may therefore assume the sloped or angled orientation of the fixture transfer rail 147.

Figure 11:
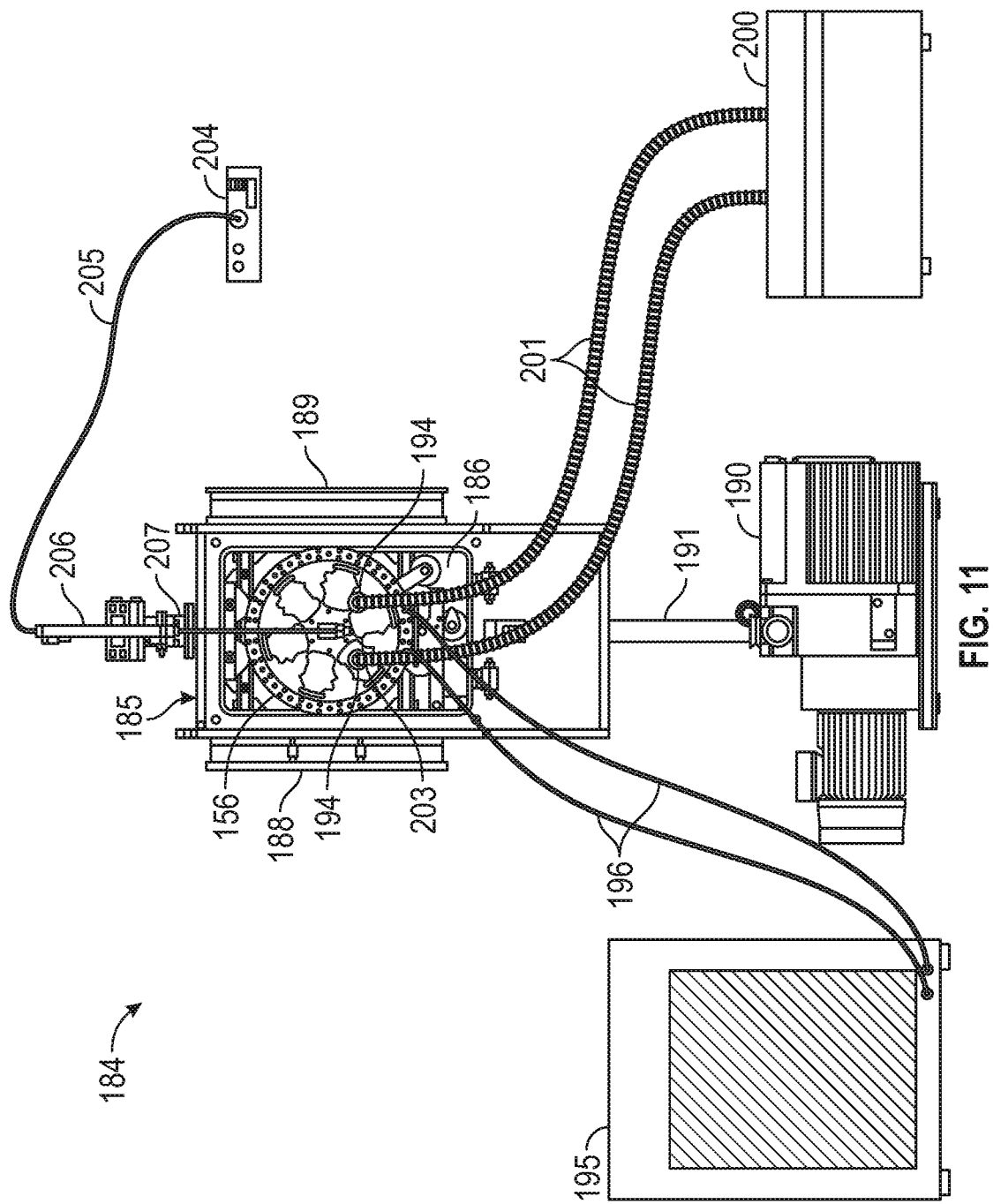
FIG. 11 is a front view of a film applicator which is suitable for implementation of an illustrative embodiment of the physical vapor deposition system, further illustrating an interior view of the physical vapor deposition chamber and a fixture carrier assembly functionally deployed in the chamber.
Figure 12:
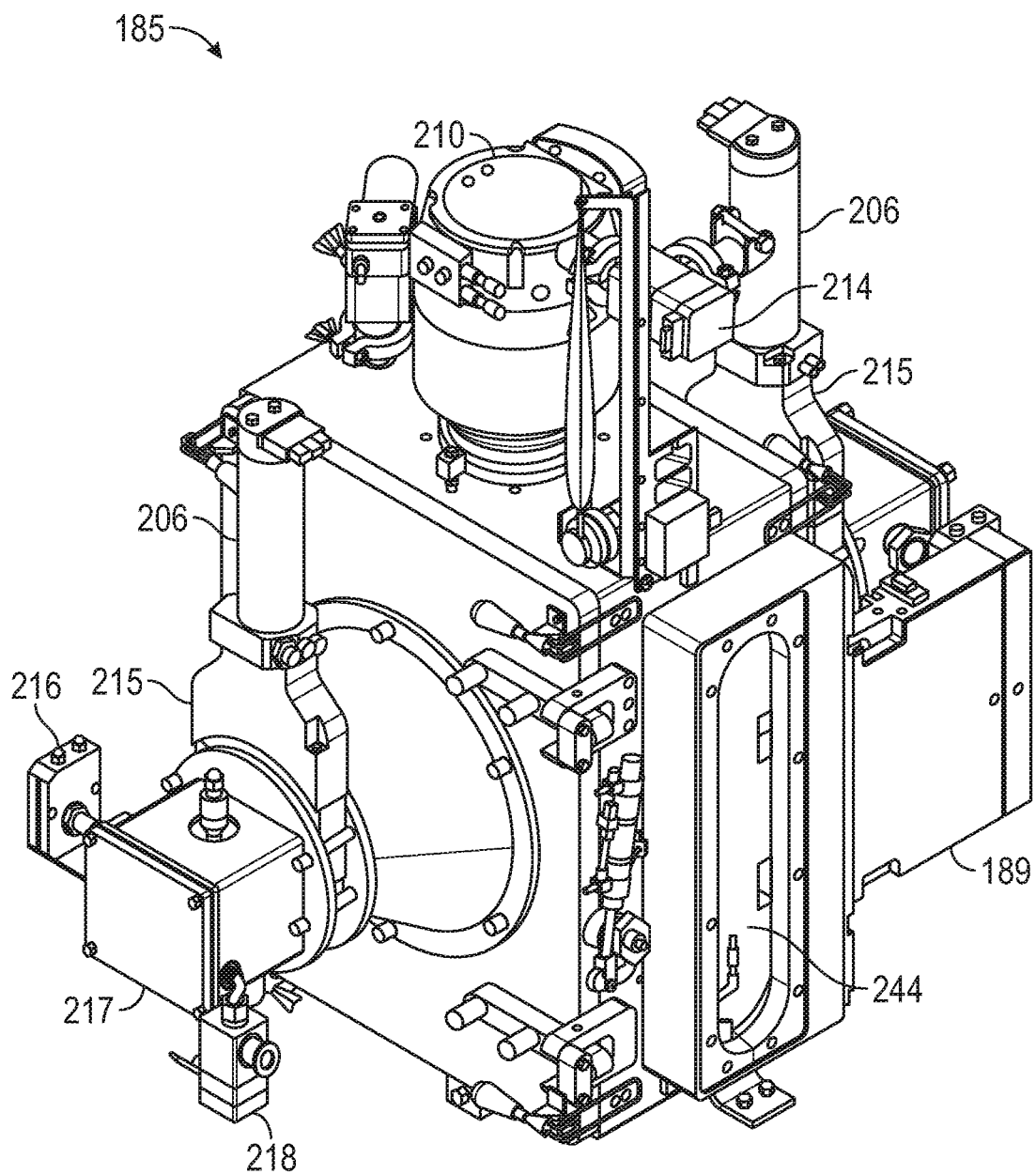
FIG. 12 is a front perspective view of an exemplary physical vapor deposition chamber of the film applicator.
Figure 13:
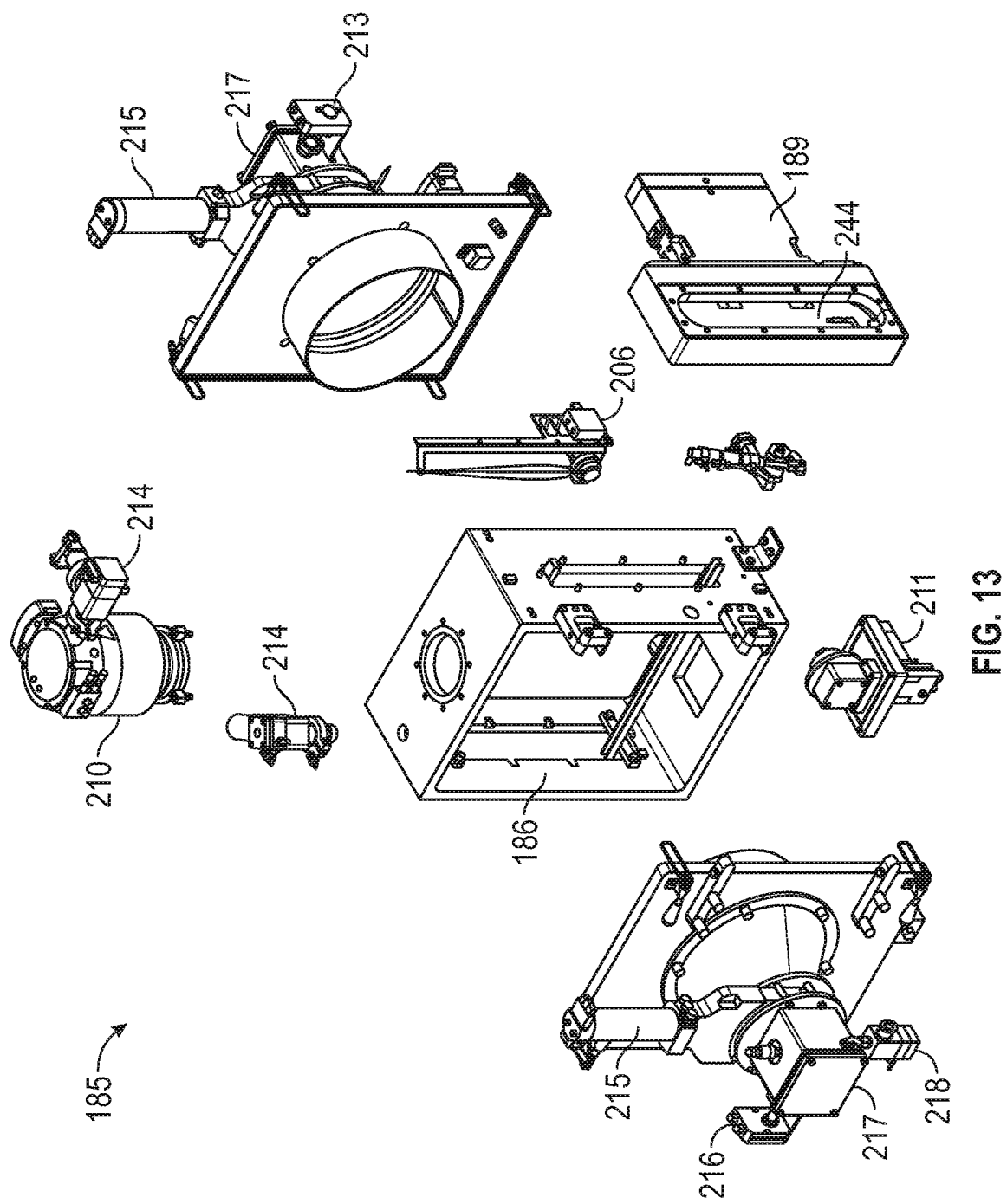
FIG. 13 is an exploded front perspective view of an exemplary physical vapor deposition chamber of the film applicator.
Figure 14:
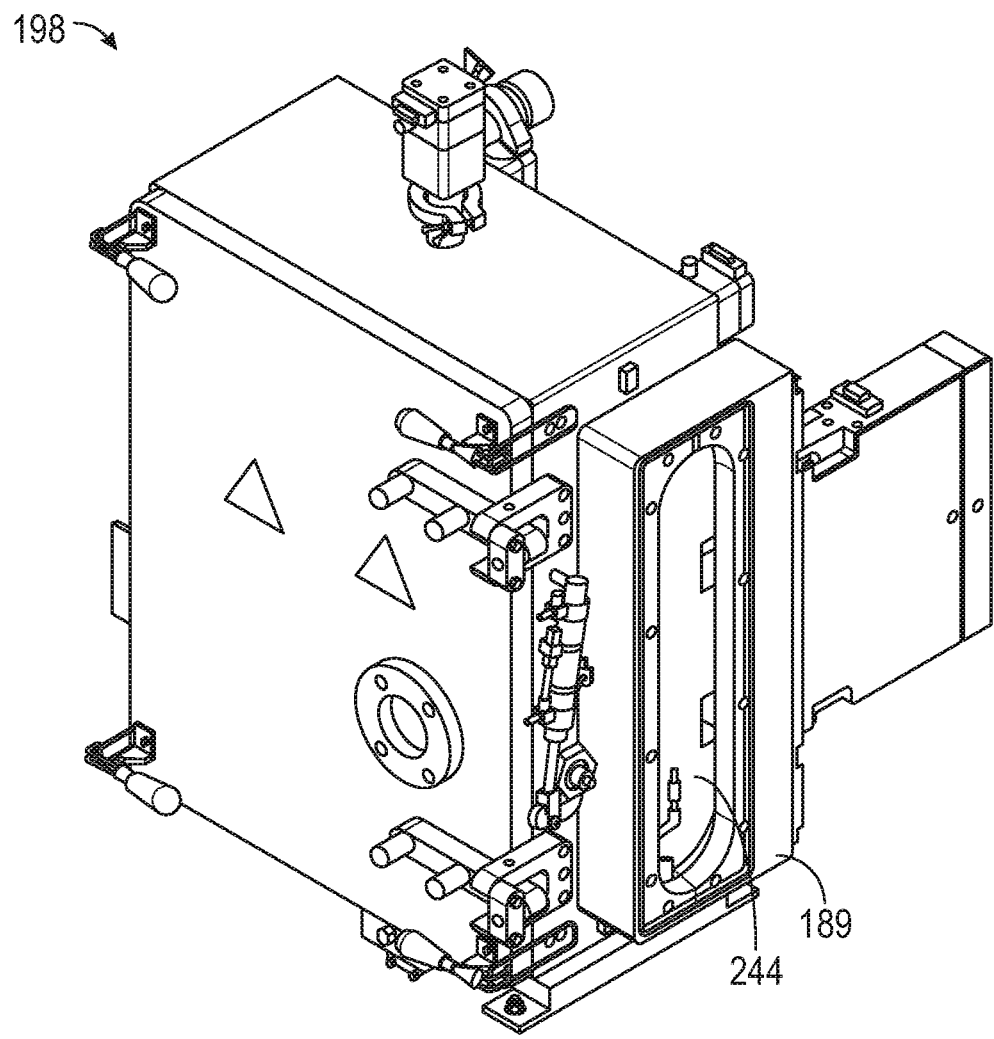
FIG. 14 is a front perspective view of an exemplary etching chamber of the film applicator.
Figure 15:
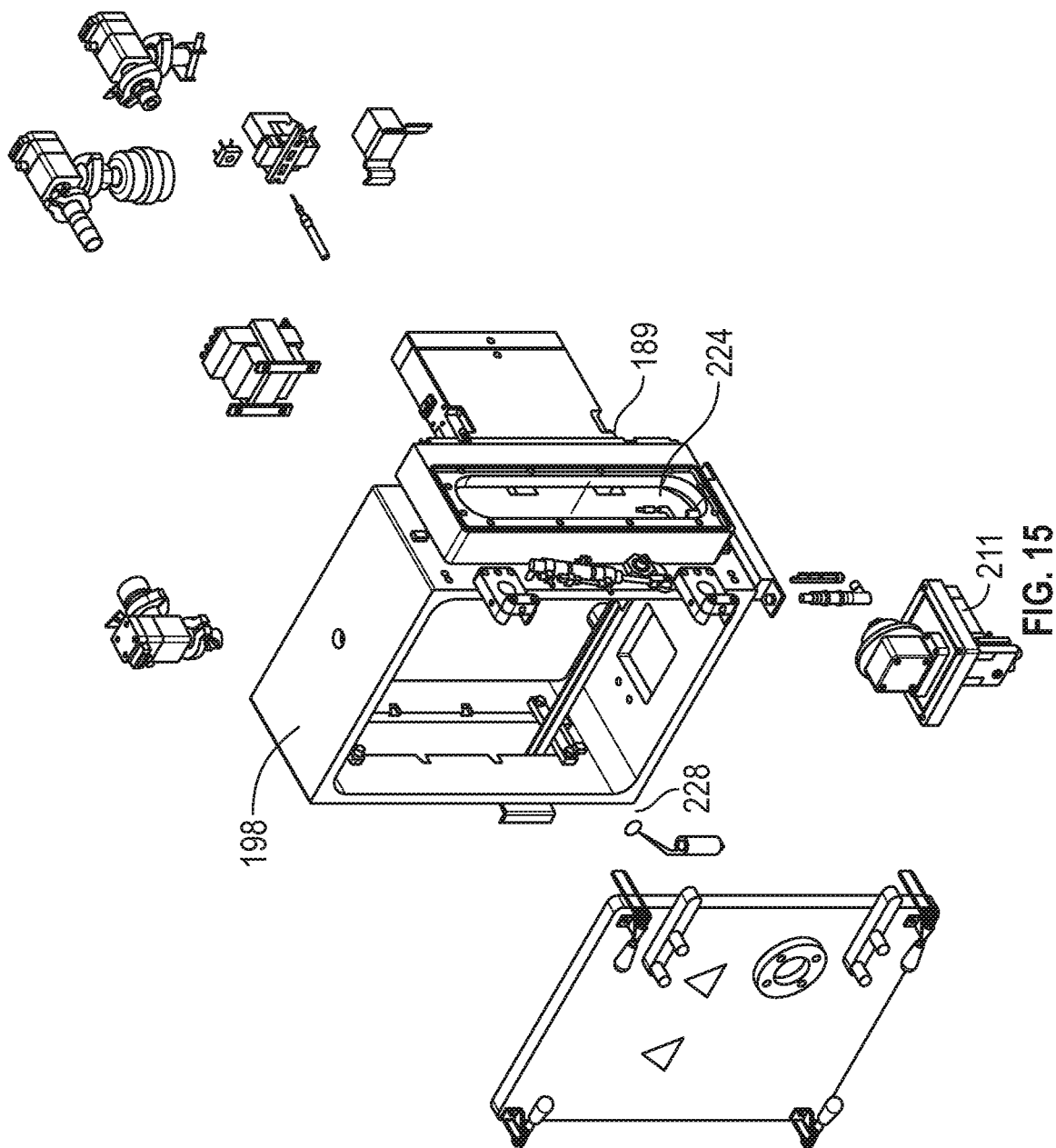
FIG. 15 is an exploded front perspective view of an exemplary etching chamber of the film applicator.
Figure 16:
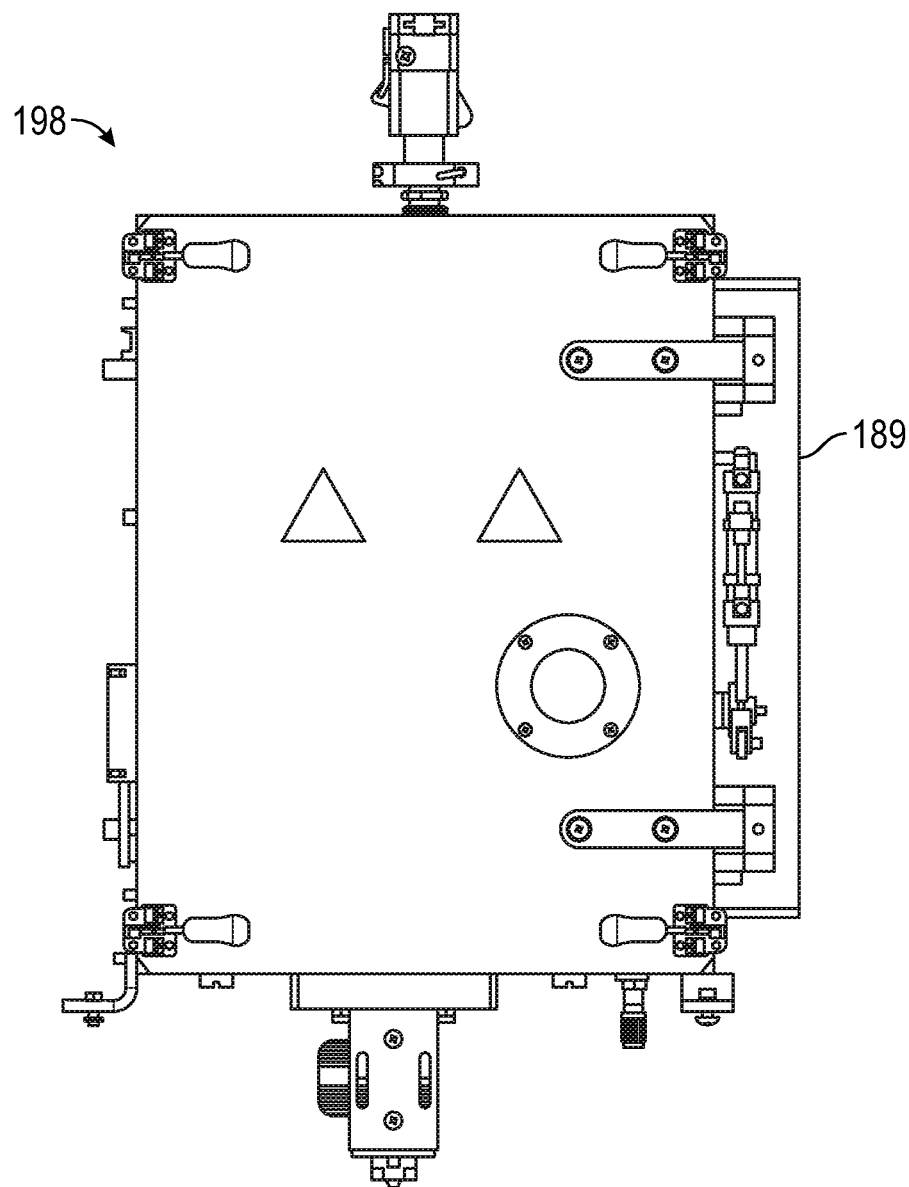
FIG. 16 is a front view of an exemplary etching chamber of the film applicator.
Figure 17:
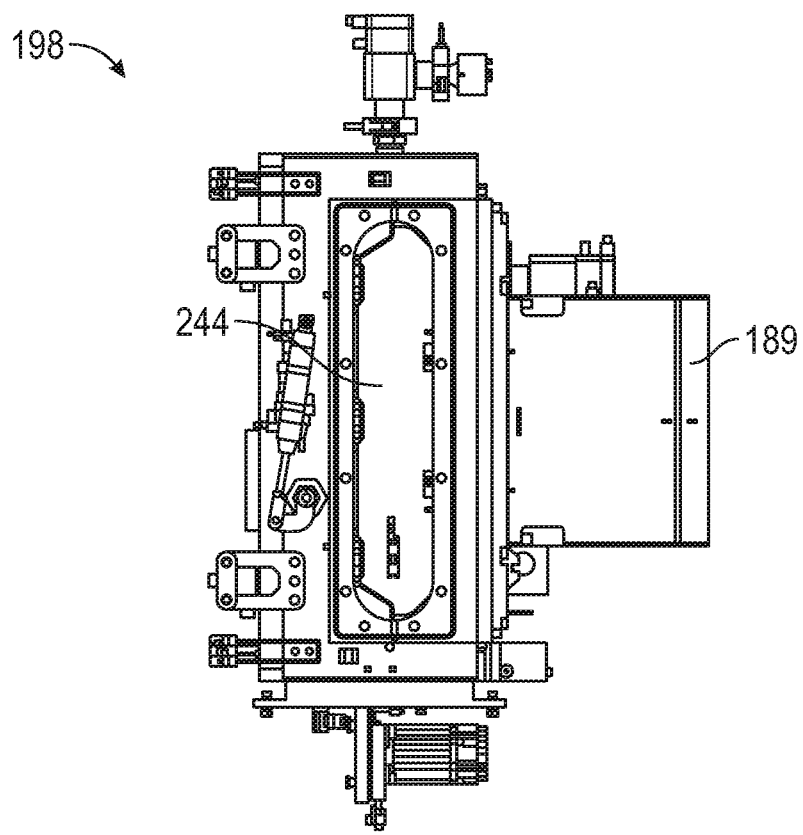
FIG. 17 is an elevated side view of an exemplary etching chamber of the film applicator.
Figure 18:
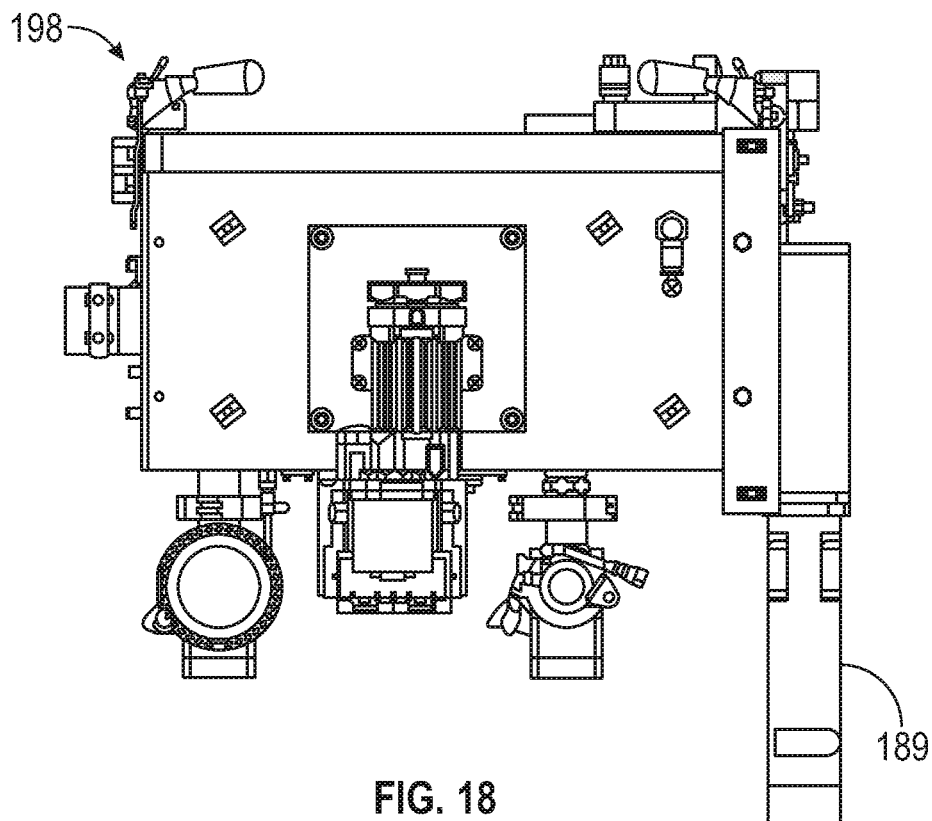
FIG. 18 is a bottom view of an exemplary etching chamber of the film applicator.

Referring next to FIGS. 11-13 of the drawings, each PVD chamber 185 may have a PVD chamber interior 186 (FIG. 11). The PVD chamber interior 186 of each PVD chamber 185 may be adapted to receive and contain a fixture carrier assembly 156 in application of the system 100, which will be hereinafter described. A fixture entry valve 188 may be disposed in fluid communication with the PVD chamber interior 186 at an inlet side of the PVD chamber 185. A fixture outlet valve 189 may be disposed in fluid communication with the PVD chamber interior 186 at an outlet side of the PVD chamber 185. The fixture entry valves 188 and the fixture outlet valves 189 may couple the first PVD chamber 185a to the etching chamber 198 and the PVD chambers 185a-185d to each other with a vacuum-tight seal in the chamber compartment 126 of the housing interior 124. In operation of the system 100, which will be hereinafter further described, the fixture entry valve 188 and the fixture outlet valve 189 may facilitate sequential transfer of each of multiple fixture carrier assemblies 156 into and out of, respectively, the PVD chamber interior 186 of each PVD chamber 185.

As further illustrated in FIG. 11, each PVD chamber 185 may be part of a film applicator system 184. The film applicator system 184 may include a roughing pump 190 which is disposed in fluid communication with the PVD chamber interior 186 of the PVD chamber 185 through a roughing pump conduit 191. Water-cooled evaporation sources 194 may be provided in the PVD chamber interior 186 of the PVD chamber 185. A water chiller 195 may be connected to the water-cooled evaporation sources 194 through a pair of water hoses 196. An evaporation power supply 200 may be electrically connected to the water-cooled evaporation sources 194 through a pair of power cables 201.

At least one liquid delivery injection arm 206 may be disposed in fluid communication with the PVD chamber interior 186 of the PVD chamber 185. As illustrated in FIG. 12, in some embodiments, a pair of front and rear liquid delivery injection arms 206 may be disposed in fluid communication with the PVD chamber interior 186. An arm internalization mechanism 207 may engage each liquid delivery injection arm 206 for internalization of the liquid delivery injection arms 206 through respective front and back side liquid delivery ports (not illustrated) into the PVD chamber interior 186 in operation of the system 100. When in the internalized configuration, the liquid delivery injection arms 206 may be positioned on opposite front and back sides of the fixture carrier assembly 156. A deposition liquid delivery system 204 may be disposed in fluid communication with the liquid delivery injector arms 206 through liquid delivery lines 205.

As illustrated in FIG. 13, a turbomolecular pump 210 may be disposed in fluid communication with the PVD chamber interior 186 (FIG. 11) of the PVD chamber 185. As illustrated in FIG. 13, the PVD chamber 185 may include a fixture rotation mechanism 211 which facilitates rotation of the fixture carrier assembly 156 (FIG. 11) in the PVD chamber interior 186 of the PVD chamber 185. The fixture rotation mechanism 211 may include a movement sensor (not shown) which senses movement of the fixture carrier assembly 156 in the PVD chamber interior 186. As further illustrated in FIG. 13, a vacuum valve 214 may be disposed in fluid communication with the PVD chamber interior 186 of the PVD chamber 185D. A vacuum valve 214 may communicate with the turbomolecular pump 210.

The system 100 is operable to allow the application of a super hydrophobic (SHP) chemical to the lens in a high vacuum condition through evaporation in a PVD chamber 185. In one embodiment, two chambers 217, representing front and back application of SHP, are isolated from a high vacuum chamber via gate valves 215. During application of the SHP, the gate valve 215 is opened and a heater with SHP is rotated into the evaporation position then heated up to cause evaporation of the SHP. Under high vacuum, the evaporant is distributed to the lens, while the fixture carrier assembly 156 (FIG. 11) is rotated for uniformity by rotation mechanism 211. After application, the heater is turned off and rotated back into the dispense position using rotation actuator 213 after which the gate valves 215 are closed. The two chambers 217 are now allowed to vent to atmosphere so that SHP may now be dispensed. The chambers 217 are then exposed to a medium vacuum which prepares it for evaporation again using roughing valve 218. The system allows for recharging of SHP without the need to vent the larger high vacuum chamber to atmosphere. It also allows for evaporation at high vacuum, which yields improved uniformity.

It will be recognized and understood that the foregoing description of each PVD chamber 185 is a general description and it will be recognized and understood that PVD chambers of various design which are known by those skilled in the art may be suitable for the purpose of depositing coatings on substrates (FIG. 10A) using physical vapor deposition techniques in operation of the system 100. Some PVD chambers 185 which are suitable for implementation of the system 100 may depart in at least some design details from the foregoing description of the PVD chamber 185 which was set forth herein above with respect to FIGS. 11-13.

Moreover, the etching chamber 198 (FIGS. 14-19) may have an etching chamber design with necessary hardware which is suitable for etching and cleaning of the substrates preparatory to deposition of coatings on the substrates by operation of the PVD chambers 185. Etching chamber designs are well-known by those skilled in the art. Generally, the etching chamber 198 may include a fixture entry valve 188 and a fixture outlet valve 189 which facilitate entry and exit of individual fixture carrier assemblies 156 into and out of, respectively, the etching chamber 198, as was heretofore described with respect to the PVD chamber 184 in FIG. 11.

The etching chamber 198 enables a method of preparing the super hydrophobic (SHP) chemical for pad application. Prior to etching, the lenses (in the planetary wheel) have had SHP applied in excess of what is necessary. The fixture carrier assembly 156 (FIG. 11) may then be introduced into the etching chamber 198 through a fixture entry valve 188, where it is rotated on the fixture carrier assembly 156. Gas plasma is generated with a plasma generating portion 228 as a cathode of sufficient size to direct the energy only where necessary while the fixture carrier assembly 156 is rotating. This plasma disturbs the excess SHP material enough to improve surface tension to allow an edging pad to stick. After completion of the edging process, the disturbed SHP can now be removed by washing with a cloth in soapy water. This restores the surface tension of the SHP to its original state, thereby retaining the properties of the SHP chemical. The lens is removed from the etching chamber 198 through the fixture outlet valve 189. This method eliminates the need for application of another material to obtain the same surface tension properties for pad application.

Figure 19:
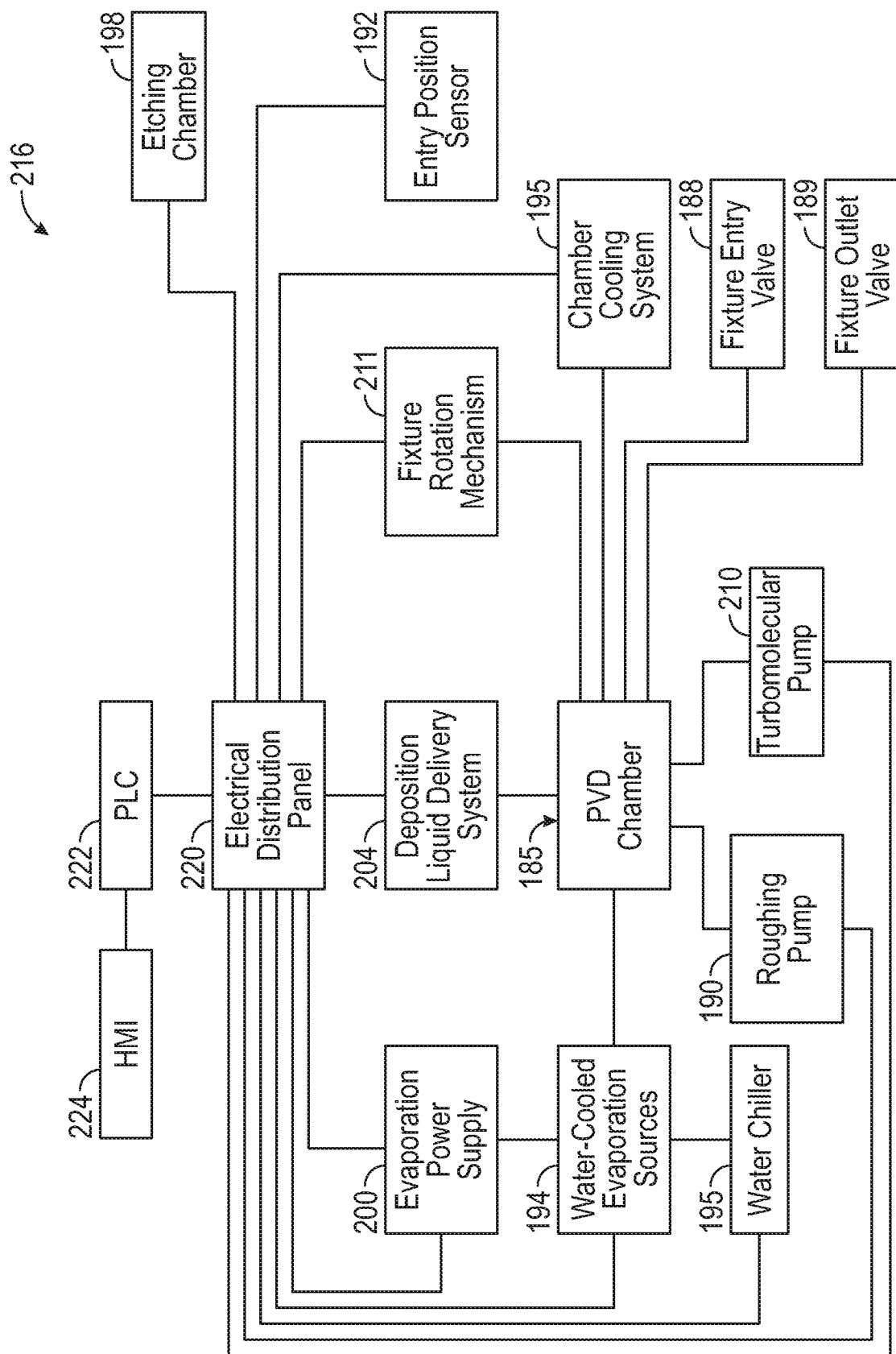
FIG. 19 is a block diagram which illustrates typical interconnection of the various subsystem components of the physical vapor deposition system.

Referring next to FIG. 19 of the drawings, a block diagram of a control system 216 which is suitable for implementation of the physical vapor deposition system 100 (FIGS. 1-9) is illustrated. The control system 216 may include a programmable logic controller (PLC) 222. A human-machine interface (HMI) 224 may interface with the PLC 222. The HMI 224 may include a keyboard, mouse and/or other elements which may be used to program the PLC 222 to operate the multiple functions of the system 100. An electrical distribution panel 220 may interface with the PLC 222. The various functional components of the system 100 may be electrically connected to the electrical distribution panel 220. Accordingly, the PLC 222 may be adapted to operate the various subsystems of the system 200 through the electrical distribution panel 220.

Some of the subsystems of the system 100 may include the roughing pump 190, the water-cooled evaporation sources 194, the deposition liquid delivery system 204, the fixture rotation mechanism 211, the fixture entry valve 188, the fixture outlet valve 189 and the turbomolecular pump 210, each of which was heretofore described with respect to FIGS. 11'-20 and each of which also is disposed inside or interfaces with the PVD chamber 185. The evaporation power supply 200 may be electrically connected to the electrical distribution panel 220 and the water-cooled evaporation sources 194 in the PVD chamber 185. The water chiller or chamber cooling system 195 may be electrically connected to the electrical distribution panel 220 and disposed in fluid communication with the water-cooled evaporation sources 194 (FIG. 11). In some embodiments, an entry position sensor 192 may be connected to the electrical distribution panel 220 and disposed at the entry position of the PVD chamber 185 adjacent to the fixture entry valve 188. The entry position sensor 192 may be adapted to sense the fixture carrier assembly 156 at the entry position of the PVD chamber 185 and enable the PLC 222 to open the fixture entry valve 188 of the PVD chamber 185 for entry of the fixture carrier assembly 156 into the PVD chamber 185, as will be hereinafter described. The etching chamber 198 may also be electrically connected to the electrical distribution panel 220 for control by the PLC via the HMI 224.

Some of the subsystems of the system 100 may be contained in the subsystem compartment 125 (FIG. 6) of the housing interior 124. As illustrated in FIGS. 6 and 9, in some embodiments, the roughing pumps 190, the water chiller 195 (not numbered) and the evaporation power supply 200 may or may not be contained in the subsystem compartment 125 in the front portion of the housing interior 124. As illustrated in FIG. 8, the electrical distribution panel 220 and the PLC 222 may be contained in the subsystem compartment 125 in the rear portion of the housing interior 124. The subsystems can be selectively exposed and accessed for repair, replacement and/or maintenance purposes by opening the front subsystem compartment doors 130 (FIG. 1) and the rear subsystem compartment door 131 (FIG. 5). Likewise, the etching chamber 198 and the PVD chambers 185 can be selectively exposed and accessed for repair, replacement and/or maintenance purposes by opening the front chamber compartment door 132 and the rear chamber compartment door 138.

Referring next to FIGS. 9 and 10A of the drawings, in exemplary application, the system 100 is operated to apply one or multiple coatings (not illustrated) to one or both sides of a substrate (FIG. 10A) in a sequential manner using a physical vapor deposition (PVD) process. In some applications, the substrate may be an optical lens which will be used in the assembly of eyewear such as eyeglasses or sunglasses, for example and without limitation. For example and without limitation, in some applications, the system 100 may be operated to plasma etch the front and backsides of an optic lens; apply a mirror coating to the front of the lens; and apply an oleophobic/hydrophobic coating to the front and backside of the lens. In other applications, the substrate may be any type of substrate to which one or more coatings is to be applied using a PVD process.

Multiple substrates (not illustrated) may be secured in each of multiple fixture carrier assemblies 156 (FIG. 10A). As will be hereinafter further described, each fixture carrier assembly 156 may serve as a vehicle for transport of the substrates between and within the etching chamber 198 and the sequential PVD chambers 185. Accordingly, each substrate may initially be secured in the fixture frame opening 172 of a corresponding substrate fixture 170. The angular positions of the lens support arms 173 in the fixture frame opening 172 may be adjusted such that the lens support arms 173 contact the substrate edge of the substrate and hold the substrate in the fixture frame opening 172 in a "floating" manner. The angle of the lens support arm 173 may also be adjusted with respect to the fixture frame 171 via the support arm pivot pins (not illustrated) as deemed necessary to ensure an optimum fit of the substrate within the orbit defined by the substrate contact blades. The substrate fixture 170 may then be secured with respect to the fixture mount plate 164 of the fixture carrier assembly 156 with the respective fixture openings 165 (FIG. 10B) in the fixture mount plate 164 receiving the respective circular members 178 of the substrate fixture 170. In some embodiments, the substrate fixture 170 may be secured with respect to the fixture mount plate 164 using the idler cartridges 162 (FIG. 10B), as was heretofore described. In alternative embodiments, the substrate fixture 170 may be secured with respect to the fixture mount plate 164 using alternative mechanisms known by those skilled in the art.

As illustrated in FIG. 10A, at least one fixture carrier assembly 156 (each containing multiple substrate fixtures 170 with substrates held in the respective fixture frame openings 172 thereof) is initially placed on the loading ramp segment 153 of the fixture transfer rail 147. In some embodiments, multiple fixture carrier assemblies 156 may be placed in series on the loading ramp segment 153 of the fixture transfer rail 147. Each fixture carrier assembly 156 may be lowered in place on the loading ramp segment 153 such that the circumferential rail-groove 161 (FIG. 10B) in the assembly frame 157 of the fixture carrier assembly 156 receives the loading ramp segment 153 of the fixture transfer rail 147. Each fixture carrier assembly 156 may therefore be self-standing on the loading ramp segment 153.

Due to the angled or sloped configuration of the loading ramp segment 153, each fixture carrier assembly 156 has a tendency to roll under influence of gravity on the fixture transfer rail 147 from the first fixture loading end 148 toward the fixture unloading end 149 thereof. Accordingly, the fixture carrier assembly 156 (FIG. 8) which is first in the series of multiple fixture carrier assemblies 156 on the loading ramp segment 153 rolls to a "ready" position adjacent to a fixture entry valve (not illustrated) at the inlet of the etching chamber 198. The next fixture carrier assembly 156 rolls into the space which was previously occupied by the first fixture carrier assembly 156, and the remaining fixture carrier assemblies 156 roll into the spaces previously occupied by the preceding fixture carrier assemblies 156, respectively.

The system 100 is initialized and enters a standby condition as the PLC 222 is turned on. The operational parameters (temperature, pressure, etc.) for the etching process which is to be carried out in the etching chamber 198 and for each of the deposition processes which are to be sequentially carried out in the PVD chambers 185 may be programmed into the PLC 222 (FIG. 19) through the HMI 224. An entry position sensor 192 (not illustrated) at the "ready" position adjacent to the fixture entry valve (not illustrated) of the etching chamber 198 senses the location of the first fixture carrier assembly 156 at the "ready" position and transmits a signal to the PLC 222. In response, the PLC 222 opens the fixture entry valve of the etching chamber 198 and the first fixture carrier assembly 156 rolls into the etching chamber 198. Simultaneously, the front and back side liquid delivery ports (not illustrated) of the last PVD chamber 185*d* are opened and the front and rear liquid delivery injector arms 206, under actuation by the arm internalization mechanisms 207 (FIG. 11), descend into the last PVD chamber 185*d*. The PLC 222 then closes the fixture entry valve of the etching chamber 198 and establishes the programmed pressure in the etching chamber 198. The next fixture carrier assembly 156 in line on the loading ramp segment 153 rolls on the fixture transfer rail 147 under the influence of gravity into the "ready" position next to the fixture entry valve of the etching chamber 198.

After the PLC 222 establishes the etching pressure and other operational parameters which were preprogrammed into the PLC 222, the etching chamber 198, under control by the PLC 222, etches and cleans both surfaces of each substrate which is held in the first fixture carrier assembly 156. After etching and cleaning of the substrates in the first fixture carrier assembly 156 is completed, the PLC 222 opens a fixture outlet valve 189 of the etching chamber 198 and the first fixture carrier assembly 156 rolls from the etching chamber 198 into the entry position of the first PVD chamber 185*a*. The entry position sensor 192 (FIG. 19) senses that the first fixture carrier assembly 156 is at the entry position of the first PVD chamber 185*a* and transmits a signal to the PLC 222 indicating the entry position of the first fixture carrier assembly 156. The first fixture carrier assembly 156 rolls into place in the PVD chamber interior 186 of the first PVD chamber 185*a*. The PLC 222 then closes the fixture entry valve 188. The PLC 222, responsive to input from the entry sensor (not illustrated) at the "ready" position of the etching chamber 198, vents the etching chamber 198 to atmosphere, opens the fixture entry valve (not illustrated) of the etching chamber 198 and the fixture carrier assembly 156 which was next in line behind the first fixture carrier assembly 156 rolls on the fixture transfer rail 147 into the etching chamber 198. The PLC 222 establishes the etching pressure and other operational parameters which were preprogrammed into the PLC 222, the etching chamber 198, under control by the PLC 222, etches and cleans both surfaces of each substrate which is held in the first fixture carrier assembly 156.

Simultaneously, After a predetermined period of time has elapsed to ensure thorough coating of the substrates, the PLC 222 then opens the fixture outlet valve 189 of the first PVD chamber 185*a* such that the first fixture carrier assembly 156 rolls under influence of gravity from the chamber interior 186 of the first PVD chamber 185*a* to the fixture entry position of the second PVD chamber 185*b*. The PLC 222 then closes the fixture outlet valve 189 of the first PVD chamber 185*a* and vents the etching chamber 198. The same PVD and transfer process is then carried out on the substrates of the first fixture carrier assembly 156 in the second PVD chamber 185*b*, the third PVD chamber 185*c* and the fourth PVD chamber 185*d* until the desired coatings have been sequentially applied to the surfaces of each substrate. The fixture rotation mechanism 211 (FIG. 13) may rotate the fixture carrier assembly 156 in any chamber interior 186 as programmed in the PLC 222. As the PVD process is carried out in the first PVD chamber 185*a*, the substrates held in the fixture carrier assembly 156 which was next in line behind the first fixture carrier assembly 156 are etched in the etching chamber 198. The substrates in that next-in-line fixture carrier assembly 156 are then subjected to the PVD processes in the first PVD chamber 185*a*, the second PVD chamber 185*b*, the third PVD chamber 185*c* and the fourth PVD chamber 185*d* in the same manner as the substrates in the first fixture carrier assembly 156.

The deposition liquid (not illustrated) which will form the coatings on one or both surfaces of each substrate in the first fixture carrier assembly 156 is dispensed from the deposition liquid delivery system 204 (FIG. 12) through the respective liquid delivery lines 205 to the liquid delivery injector arms 206. The liquid delivery injector arms 206 dispense the deposition liquid into the water-cooled evaporation sources 203 (FIG. 11) in the chamber interior 186. Once the deposition liquid is fully dispensed into the evaporation sources 194, the liquid delivery injector arms 206 are retracted from the chamber interior 186 and the liquid delivery ports (not illustrated) are closed. Next, the fixture rotation mechanism 211 (FIG. 13) may rotate the first fixture carrier assembly 156 in the chamber interior 186 and the PLC 222 pulls vacuum on the last PVD chamber 185*d* via the roughing pump 190 and the turbomolecular pump 210. Once the correct level of vacuum pressure in the PVD chamber interior 186 has been achieved, the deposition liquid in the evaporation sources 194 is evaporated into the chamber interior 186, coating the substrates in the first fixture carrier assembly 156. As the fixture carrier assemblies 156 traverse the fixture transfer rail 147 and the PVD chambers 185 and etching chamber 198, the independent rotation of the circular members 178 of the substrate fixture 170 and the fixture mount plate 182 of each fixture carrier assembly 156 may enhance uniform deposition on the plurality of substrates in the fixture frame openings 172 of the respective circular members 178.

After the PVD processes in the fourth PVD chamber 185*d* are completed, the fixture carrier assemblies 156 sequentially roll from the fourth PVD chamber 185*d* onto the unloading ramp segment 154 of the fixture transfer rail 147. The fixture carrier assemblies 156 are removed from the unloading ramp segment 154, and the substrate fixture 170 (FIG. 10B) may be removed from the fixture mount plate 164 as the circular members 178 are removed from the respective fixture openings 165 in the fixture mount plate 164. Finally, the substrates may be removed from the respective fixture frame openings 172 in the circular members 178 of the substrate fixture 170 for further processing. During use of the system 100, the PLC 222 may operate the chamber cooling system 236 (FIG. 19) to regulate the PVD chamber interior 186 (FIG. 13) and operating systems of each PVD chamber 185 as deemed necessary.

It will be appreciated by those skilled in the art that the physical vapor deposition system 100 is capable of processing substrates in multiple fixture carrier assemblies 156 at the same time by simultaneous operation of the etching chamber 198 and the PVD chambers 185. This expediently facilitates high-speed, low-volume and high-throughput production of thin film-coated substrates using physical vapor deposition processes. Moreover, transfer of the fixture carrier assemblies 156 between the etching chamber 198 and the successive fixture carrier assemblies 156 by gravity eliminates the need for mechanical structure and related power supply which would otherwise be required for the transfer operation. The system 100 may be designed such that the chamber functions and capabilities are flexible and can be adapted for various types of physical or chemical vapor, corona or thermal deposition applications on different types of substrates. Examples include but are not limited to ophthalmic mirror coatings, ophthalmic anti-reflective coatings, protective coatings, cosmetic coatings, compact disc manufacturing electronic wafer manufacturing and medical device manufacturing. The construction methods and materials for the system 100 may be tailored according to the particular thin or thick films which are to be applied to the substrates. The system 100 may be constructed in any of various sizes depending on the desired application. Various alternative designs for the subsystems, assemblies and components may be used in various embodiments of the system 100. The system 100 may be fabricated using a variety of fabrication techniques including but not limited to welding, brazing, connectors, terminal blocks, screws, bolts, nuts and clamps.

Various structural provisions instead of or in addition to those which were heretofore described with respect to the drawings may be made for the functioning and distribution of the vacuum subsystem, pneumatic subsystem, electrical subsystem and/or any other subsystems or components which may be deemed necessary for operation of the etching chamber 198, the PVD chambers 185 or any other operational component or subsystem of the system 100. For example and without limitation, as illustrated in FIG. 6, vacuum system conduits 191 may be routed throughout the housing interior 124 to provide connection between the roughing pumps 190, turbomolecular pumps 210 and/or other pumps and the etching chamber 198 or the PVD chambers 185. As illustrated in FIG. 5, pneumatic system conduits 242 may provide connection between vacuum subsystem components or pneumatic subsystem components and the etching chamber 198 or PVD chambers 185. Pneumatic system ports 244 (FIGS. 13, 14, 15, 17) may be provided in the fixture transfer rail 147 and/or other structural components of the system 100 for functioning of the pneumatic subsystem. Other structural provisions may include whichever supports, wiring and plumbing may be necessary to interconnect all components and subsystems.

The film applicator system 184 (FIG. 11) of the system 100 may be designed as a stand-alone unit, as part of an in-line deposition system or as part of a larger, more complex system. The film applicator system 184 can coat one side or two sides of a substrate and a two-sided coating applied to the substrate may be performed individually or simultaneously at high speeds and high throughput. The film applicator system 184 may be operated manually, semi-automatically or fully automatically via a computer or the PLC 222 and HMI 224 (FIG. 19).

The substrate fixtures 170 (FIG. 10B) may be configured to hold the substrates in such a manner that each substrate is suspended in space and each substrate can be coated evenly across the surface without hindrance. Each substrate fixture 170 may function as a flexible platform to hold various lenses and other substrates in different configurations to ensure that the substrates may be coated from both sides simultaneously. The substrate fixture 170 and other components of each fixture carrier assembly 156 may be constructed of various materials depending on the particular application. The fixture carrier assemblies 156 may be constructed for single-side application and may be fabricated in various sizes. Alternative methods of holding the substrates in the fixture frame openings 172 of the substrate fixture 170 may be used. Moreover, the design of each fixture carrier assembly 156 and each substrate fixture 170, as well as each PVD chamber 185 as described and illustrated herein, may facilitate uniform coating of either or both surfaces of each substrate depending on the desired application.

Figure 20:
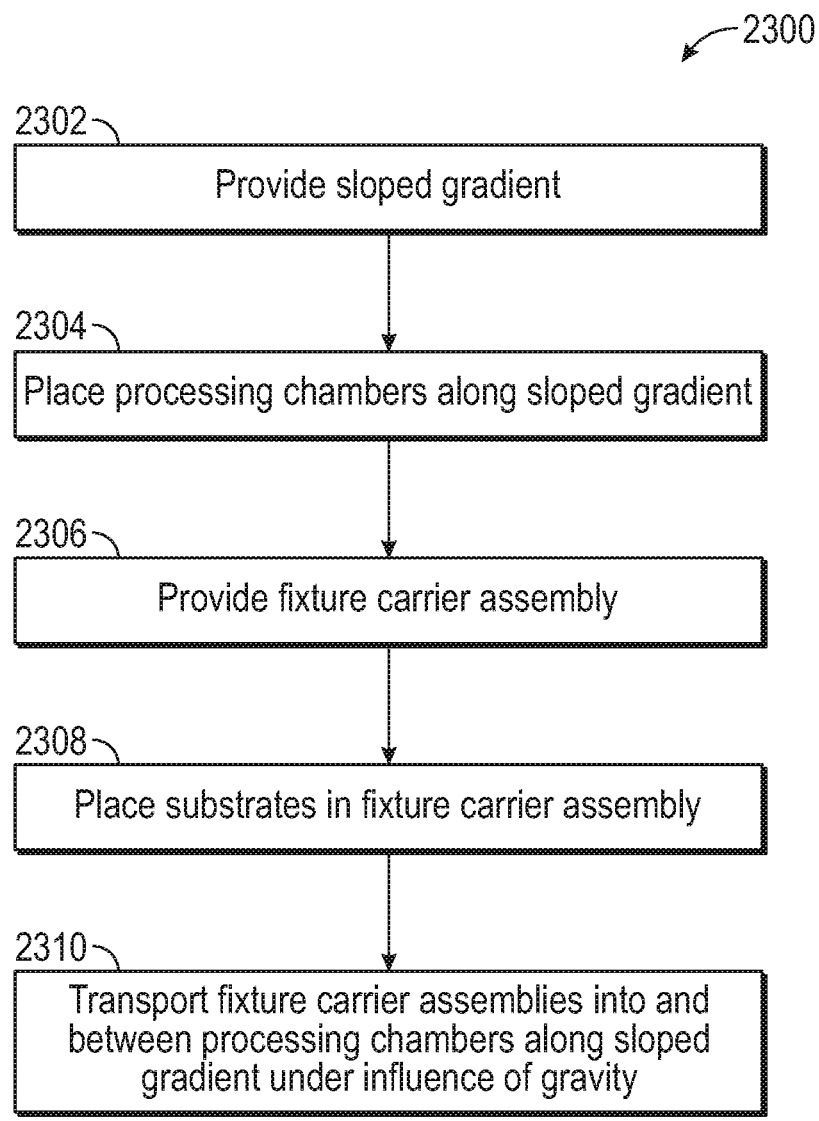
FIG. 20 is a flow diagram of an illustrative embodiment of a physical vapor deposition method.

Referring next to FIG. 20 of the drawings, a flow diagram 2300 of an illustrative embodiment of a physical vapor deposition method is illustrated. In block 2302, a sloped gradient is provided. In block 2304, processing chambers are placed along the sloped gradient. In some applications, the processing chambers may include an etching chamber and at least one physical vapor deposition (PVD) chamber. In some embodiments, the processing chambers may include an etching chamber and multiple sequentially-ordered PVD chambers. In block 2306, at least one fixture carrier assembly is provided. In block 2308, substrates are placed in the fixture carrier assembly. In block 2310, the fixture carrier assemblies are transported into and between the processing chambers along the sloped gradient under the influence of gravity. The design of each PVD chamber and each fixture carrier assembly may facilitate uniform or non-uniform deposition of one or more coatings on either or both surfaces of each substrate.

While various illustrative embodiments of the disclosure have been described above, it will be recognized and understood that various modifications can be made in the disclosure and the appended claims are intended to cover all such modifications which may fall within the spirit and scope of the embodiments of the disclosure.

What is claimed is:

1. A deposition system, comprising:
    a system housing having a housing interior;
    a fixture transfer assembly having a generally sloped fixture transfer rail extending through the housing interior;
    a plurality of sequentially ordered deposition chambers carried by the fixture transfer rail in the housing interior;
    a controller interfacing with the plurality of deposition chambers;
    at least one circular fixture carrier assembly carried by the fixture transfer rail and adapted to contain a plurality of substrates, the at least one circular fixture carrier assembly including:
        a fixture mount plate, the fixture mount plate configured to rotate in a first direction;
        a plurality of fixture openings in the fixture mount plate;
        a substrate fixture having a fixture frame including a plurality of circular members, wherein each of the plurality of circular members comprise a plurality of fixture frame openings, respectively, the plurality of circular members disposed in the plurality of fixture openings of the fixture mount plate, respectively, the circular members joined in an annular arrangement around a concentric center hub, each circular member having a fixture frame opening sized to receive a corresponding one of the plurality of substrates, the plurality of circular members of the fixture frame configured to rotate in a second direction;
        wherein the independent rotation of the plurality of circular members and the fixture mount plate enhance uniform deposition on the plurality of substrates; and
    wherein the at least one fixture carrier assembly travels along the fixture transfer rail under influence of gravity.

2. The deposition system of claim 1 wherein the fixture transfer rail of the fixture transfer assembly comprises a loading ramp segment and an unloading ramp segment extending from the housing interior at opposite sides of the system housing.

3. The deposition system of claim 1 wherein the plurality of circular members comprises six circular members.

4. The deposition system of claim 1 further comprising a front rim securing the plurality of circular members in the plurality of fixture openings, respectively.

5. The deposition system of claim 1 wherein the housing interior of the system housing comprises a subsystem compartment and a chamber compartment, and wherein the plurality of deposition chambers and an etching chamber are contained in the chamber compartment.

6. The deposition system of claim 5 wherein the system housing comprises at least one subsystem compartment door adapted to selectively open and close the subsystem compartment and at least one chamber compartment entry adapted to selectively open and close the chamber compartment.

7. The deposition system of claim 6 wherein the at least one subsystem compartment entry comprises first and second subsystem compartment doors and the at least one chamber compartment entry comprises first and second chamber compartment entry.

8. The deposition system of claim 1 further comprising an assembly frame, and wherein the fixture mount plate is carried by the assembly frame.

9. The deposition system of claim 8 further comprising a circumferential rail groove in the assembly frame and receiving the fixture transfer rail of the fixture transfer assembly.

10. The deposition system of claim 1 wherein the plurality of sequentially ordered deposition chambers are physical vapor deposition chambers.

11. The deposition system of claim 10 further comprising a chamber cooling system interfacing with each of the physical vapor deposition chambers and the controller.

12. The deposition system of claim 11 further comprising a human-machine interface interfacing with the controller.

13. The deposition system of claim 1 further comprising a plurality of lens support arms extending from each of the plurality of circular members into each of the plurality of fixture frame openings, the plurality of lens support arms further configured to engage each corresponding one of the plurality of substrates.

14. A deposition system, comprising:
    a system housing having a housing interior;
    a fixture transfer assembly having a generally sloped fixture transfer rail extending through the housing interior;
    a plurality of sequentially ordered deposition chambers carried by the fixture transfer rail in the housing interior;

a controller interfacing with the plurality of deposition chambers;

at least one circular fixture carrier assembly carried by the fixture transfer rail and adapted to contain a plurality of substrates, the at least one circular fixture carrier assembly including:

an assembly frame having a frame opening;

a frame flange extending from the assembly frame into the frame opening;

a plurality of frame undulations in the frame flange and communicating with the frame opening;

a fixture mount plate carried by the assembly frame, the fixture mount plate configured to rotate in a first direction;

a plurality of fixture openings in the fixture mount plate;

a substrate fixture having a fixture frame including a plurality of circular members, wherein each of the plurality of circular members comprise a plurality of fixture frame openings, respectively, the plurality of circular members disposed in the plurality of fixture openings of the fixture mount plate, respectively, the circular members joined in an annular arrangement around a concentric center hub, each circular member having a fixture frame opening sized to receive a corresponding one of the plurality of substrates, the plurality of circular members of the fixture frame configured to rotate in a second direction;

wherein the independent rotation of the plurality of circular members and the fixture mount plate enhance uniform deposition on the plurality of substrates; and a plurality of integrated lens support arms defined by a generally curved and adjustable configuration, the plurality of integrated lens support arms configured to integrate with the plurality of circular members, the plurality of integrated lens support arms further configured to extend inwardly into each corresponding one of the plurality of fixture frame openings, the plurality of integrated lens support arms further configured to be flexibly manipulated in the each corresponding one of the plurality of fixture frame openings for engaging each corresponding one of the plurality of substrates; and wherein the at least one fixture carrier assembly travels along the fixture transfer rail under influence of gravity.

15. The deposition system of claim 14 further comprising a plurality of idler cartridges securing the substrate fixture to the fixture mount plate by clamping engagement with the respective circular members on the fixture frame of the substrate fixture and the fixture mount plate.

16. The deposition system of claim 14 further comprising a center shield with solenoid hub stop mounted in at least one of the plurality of sequentially ordered deposition chambers, the center shield with solenoid hub stop configured for engagement with the center hub of the substrate fixture, the center shield with solenoid hub stop is capable of being periodically engaged to stop the center hub from spinning, thereby facilitating advancement of the center hub $\frac{1}{3}$ of a revolution at a time.

17. The deposition system of claim 14 further comprising an RFID tag carried by the fixture mount plate for tracking the at least one fixture carrier assembly.

* * * * *